US011322554B2

(12) United States Patent
Song

(10) Patent No.: US 11,322,554 B2
(45) Date of Patent: May 3, 2022

(54) DISPLAY APPARATUS

(71) Applicant: SAMSUNG DISPLAY CO., LTD., Yongin-si (KR)

(72) Inventor: Jungbae Song, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 6 days.

(21) Appl. No.: 17/085,047

(22) Filed: Oct. 30, 2020

(65) Prior Publication Data
US 2021/0305322 A1 Sep. 30, 2021

(30) Foreign Application Priority Data

Mar. 25, 2020 (KR) .......................... 10-2020-0036437

(51) Int. Cl.
*H01L 27/32* (2006.01)
*H01L 27/12* (2006.01)
*H01L 51/50* (2006.01)

(52) U.S. Cl.
CPC ........ *H01L 27/322* (2013.01); *H01L 27/1237* (2013.01); *H01L 27/3258* (2013.01); *H01L 51/5036* (2013.01)

(58) Field of Classification Search
CPC .............. H01L 27/322; H01L 27/1237; H01L 27/3258; H01L 51/5036; H01L 51/5284; H01L 27/3232; H01L 27/3272
See application file for complete search history.

(56) References Cited

U.S. PATENT DOCUMENTS

| 7,307,382 B2 | 12/2007 | Uhlig et al. |
| 7,884,900 B2 | 2/2011 | Doi et al. |

(Continued)

FOREIGN PATENT DOCUMENTS

| JP | 4912570 B2 | 4/2012 |
| KR | 100567223 B1 | 4/2006 |

(Continued)

*Primary Examiner* — Kevin Quarterman
(74) *Attorney, Agent, or Firm* — Cantor Colburn LLP

(57) ABSTRACT

A display apparatus includes a lower substrate, first to third light-emitting devices arranged on the lower substrate, where the first to third light-emitting devices each includes a color emission layer, an upper substrate arranged above the lower substrate with the first to third light-emitting devices therebetween, a first insulating layer arranged on a lower surface of the upper substrate in a direction to the lower substrate, the first insulating layer defining a $(1-1)^{st}$ opening corresponding to the first light-emitting device, a $(1-2)^{nd}$ opening corresponding to the second light-emitting device, and a $(1-1)^{st}$ groove connecting the $(1-1)^{st}$ opening to the $(1-2)^{nd}$ opening, a first color quantum dot layer arranged in the $(1-1)^{st}$ opening, and a second color quantum dot layer arranged in the $(1-2)^{nd}$ opening.

21 Claims, 23 Drawing Sheets

(56) References Cited

U.S. PATENT DOCUMENTS

| | | | |
|---|---|---|---|
| 9,947,731 B2 | 4/2018 | Jiao et al. | |
| 2010/0194268 A1* | 8/2010 | Choi | H01L 27/3213 |
| | | | 313/504 |
| 2014/0293392 A1 | 10/2014 | Ninan et al. | |
| 2015/0364523 A1* | 12/2015 | Sato | H01L 51/5203 |
| | | | 257/13 |
| 2017/0141162 A1 | 5/2017 | Kim et al. | |
| 2018/0059485 A1* | 3/2018 | Nam | G02F 1/133617 |
| 2018/0179441 A1 | 6/2018 | Park et al. | |
| 2019/0025634 A1 | 1/2019 | Park et al. | |

FOREIGN PATENT DOCUMENTS

| | | |
|---|---|---|
| KR | 101275656 B1 | 6/2013 |
| KR | 101809259 B1 | 12/2017 |
| KR | 1020180077086 A | 7/2018 |
| KR | 1020190010821 A | 1/2019 |

* cited by examiner

DISPLAY APPARATUS

This application claims priority to Korean Patent Application No. 10-2020-0036437, filed on Mar. 25, 2020, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus in which image spot defects are improved.

2. Description of Related Art

A display apparatus is an apparatus for displaying data visually. The display apparatus may be used as a display of small products such as mobile phones, or may be used as a display of large products such as televisions.

The display apparatus includes a plurality of pixels that receives an electric signal and emits light so as to display an image to the outside. Each pixel includes a display element. For example, an organic light-emitting display apparatus includes an organic light-emitting diode ("OLED") as the display element.

As the applications of display apparatuses have diversified, various designs have been attempted to improve the quality of the display apparatus. In particular, research has been actively conducted to prevent the appearance of spots or the like on an image implemented through the display apparatus.

SUMMARY

However, in a conventional display apparatus, spots or the like still appear in an image implemented through the display apparatus.

One or more embodiments include a display apparatus in which image spot defects are improved. However, this issue is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a lower substrate, first to third light-emitting devices arranged on the lower substrate (where the first to third light-emitting devices each includes a color emission layer), an upper substrate arranged above the lower substrate with the first to third light-emitting devices therebetween, a first insulating layer arranged on a lower surface of the upper substrate in a direction to the lower substrate, the first insulating layer defining a $(1-1)^{st}$ opening corresponding to the first light-emitting device, a $(1-2)^{nd}$ opening corresponding to the second light-emitting device, and a $(1-1)^{st}$ groove connecting the $(1-1)^{st}$ opening to the $(1-2)^{nd}$ opening, a first color quantum dot layer arranged in the $(1-1)^{st}$ opening, and a second color quantum dot layer arranged in the $(1-2)^{nd}$ opening.

According to an embodiment, the sum of a depth of the $(1-1)^{st}$ groove and a thickness of the first color quantum dot layer in a thickness direction may be less than or equal to a height of the first insulating layer.

According to an embodiment, the first insulating layer may further define a $(1-3)^{rd}$ opening corresponding to the third light-emitting device, and the first insulating layer may further define a $(1-2)^{nd}$ groove connecting the $(1-1)^{st}$ opening to the $(1-3)^{rd}$ opening.

According to an embodiment, the first insulating layer may further define a $(1-3)^{rd}$ groove connecting the $(1-2)^{nd}$ opening to the $(1-3)^{rd}$ opening.

According to an embodiment, The display apparatus may further include a second insulating layer arranged on the first insulating layer, and the second insulating layer may define a $(2-1)^{st}$ opening corresponding to the $(1-1)^{st}$ opening, a $(2-2)^{nd}$ opening corresponding to the $(1-2)^{nd}$ opening, and a $(2-1)^{st}$ through-hole connecting the $(2-1)^{st}$ opening to the $(2-2)^{nd}$ opening.

According to an embodiment, the $(2-1)^{st}$ through-hole may at least partially overlap the $(1-1)^{st}$ groove in a plan view.

According to an embodiment, the display apparatus may further include a first color filter layer arranged between the upper substrate and the first color quantum dot layer, and a second color filter layer arranged between the upper substrate and the second color quantum dot layer.

According to an embodiment, the first to third light-emitting devices may further include first to third pixel electrodes, and an opposite electrode corresponding to the first to third pixel electrodes, and the color light emission layer may be arranged between the opposite electrode and each of the first to third pixel electrodes.

According to an embodiment, the first insulating layer may include a light blocking material.

According to one or more embodiments, a display apparatus includes a lower substrate, first and second light-emitting devices arranged on the lower substrate and including a color emission layer, an upper substrate arranged above the lower substrate with the first and second light-emitting devices therebetween, a first insulating layer arranged on a lower surface of the upper substrate in a direction to the lower substrate (where the first insulating layer may define a $(1-1)^{st}$ opening corresponding to the first light-emitting device, a $(1-2)^{nd}$ opening corresponding to the second light-emitting device, and a $(1-1)^{st}$ through-hole connecting the $(1-1)^{st}$ opening to the $(1-2)^{nd}$ opening), a first color quantum dot layer arranged in the $(1-1)^{st}$ opening, and a second color quantum dot layer arranged in the $(1-2)^{nd}$ opening.

According to an embodiment, the color emission layer may be configured to emit a light of a first wavelength band, and both the first color quantum dot layer and the second color quantum dot layer may be configured to convert the light of the first wavelength band into a light of a second wavelength band.

According to an embodiment, the first color quantum dot layer and the second color quantum dot layer may be monolithic.

According to an embodiment, the display apparatus may further include a second insulating layer arranged on the first insulating layer, the second insulating layer defining a $(2-1)^{st}$ opening corresponding to the $(1-1)^{st}$ opening, a $(2-2)^{nd}$ opening corresponding to the $(1-2)^{nd}$ opening, and a $(2-1)^{st}$ through-hole connecting the $(2-1)^{st}$ opening to the $(2-2)^{nd}$ opening.

According to one or more embodiments, a display apparatus includes a lower substrate, first to third light-emitting devices arranged on the lower substrate and including a color emission layer, an upper substrate arranged above the lower substrate with the first to third light-emitting devices therebetween, a first insulating layer arranged on a lower surface of the upper substrate in a direction to the lower substrate (where the first insulating layer defines a $(1\text{-}1)^{st}$ opening corresponding to the first light-emitting device and a $(1\text{-}2)^{nd}$ opening corresponding to the second light-emitting device), a second insulating layer arranged on the first insulating layer (where the second insulating layer defines a $(2\text{-}1)^{st}$ opening corresponding to the $(1\text{-}1)^{st}$ opening, a $(2\text{-}2)^{nd}$ opening corresponding to the $(1\text{-}2)^{nd}$ opening, and a $(2\text{-}1)^{st}$ groove or a $(2\text{-}1)^{st}$ through-hole connecting the $(2\text{-}1)^{st}$ opening to the $(2\text{-}2)^{nd}$ opening), a first color quantum dot layer arranged in the $(1\text{-}1)^{st}$ opening, and a second color quantum dot layer arranged in the $(1\text{-}2)^{nd}$ opening.

According to an embodiment, a part of the first insulating layer may be exposed by the $(2\text{-}1)^{st}$ through-hole.

According to an embodiment, the second insulating layer may have an isolated shape.

According to an embodiment, the first insulating layer may further define a $(1\text{-}3)^{rd}$ opening corresponding to the third light-emitting device, and the second insulating layer may further define a $(2\text{-}3)^{rd}$ opening corresponding to the $(1\text{-}3)^{rd}$ opening, and a $(2\text{-}2)^{nd}$ groove or a $(2\text{-}2)^{nd}$ through-hole connecting the $(2\text{-}1)^{st}$ opening to the $(2\text{-}3)^{rd}$ opening.

According to an embodiment, the second insulating layer may further define a $(2\text{-}3)^{rd}$ groove or a $(2\text{-}3)^{rd}$ through-hole connecting the $(2\text{-}2)^{nd}$ opening to the $(2\text{-}3)^{rd}$ opening.

According to an embodiment, the first insulating layer and the second insulating layer may be black.

According to an embodiment, the first insulating layer and the second insulating layer may be blue.

According to an embodiment, a size of the $(1\text{-}1)^{st}$ opening may be smaller than a size of the $(2\text{-}1)^{st}$ opening.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
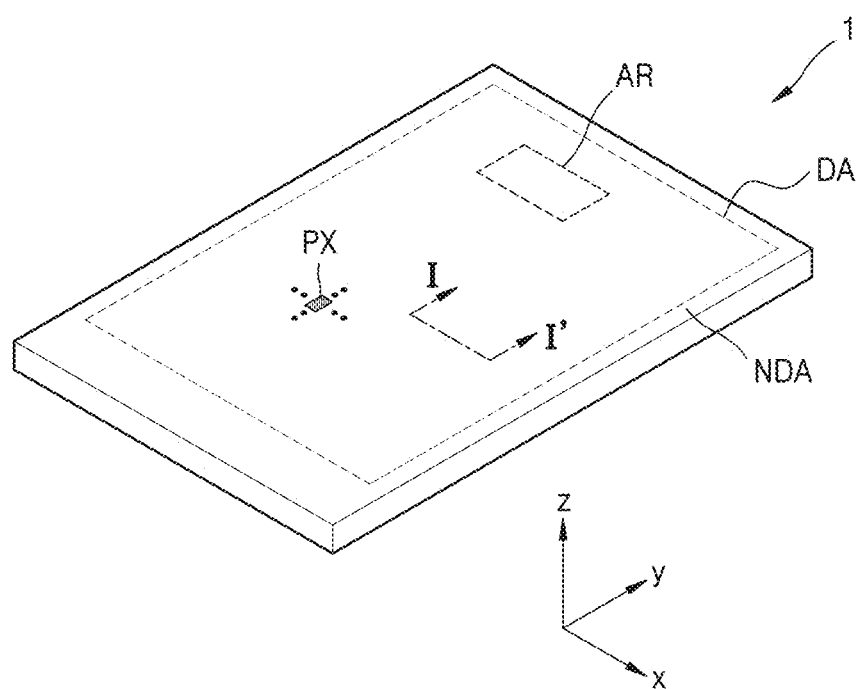
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may have various modifications and embodiments. Specific embodiments are illustrated in the drawings and will be described in detail in the detailed description. The effects and features of the disclosure and methods of achieving them will become more apparent from the following embodiments that are described in detail in conjunction with the accompanying drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals and a redundant description thereof will be omitted.

It will be understood that although the terms "first," "second," "$(1\text{-}1)^{st}$", "$(1\text{-}2)^{nd}$", "$(1\text{-}3)^{rd}$", etc. may be used herein to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because sizes and thicknesses of elements in the drawings are arbitrarily illustrated for convenience of description, the disclosure is not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. Throughout the disclosure, the expression "at least one of A or B" indicates only A, only B, or both A and B.

In the following embodiments, it will be understood that when a layer, region, or component is referred to as being "connected to" or "coupled to" another layer, region, and component, it may be directly or indirectly connected or coupled to the other layer, region, or component. That is, for example, intervening layers, regions, or components may be present. In the following embodiments, it will be understood that when a layer, region, or component is referred to as being "electrically connected to" or "electrically coupled to" another layer, region, and component, it may be directly or indirectly electrically connected or coupled to the other layer, region, or component. That is, for example, intervening layers, regions, or components may be present.

The x-axis, the y-axis and the z-axis which indicate x direction, y direction, and z direction, respectively, are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic perspective view of a display apparatus 1 according to an embodiment.

Referring to FIG. 1, the display apparatus 1 may include a display area DA in which an image is implemented and a non-display area NDA in which no image is implemented. The display apparatus 1 may provide an image to the outside by using light emitted from the display area DA.

The display apparatus 1 having a rectangular display area DA is illustrated in FIG. 1, but the disclosure according to the invention is not limited thereto. The shape of the display area DA may be a circle, an ellipse, or a polygon such as a triangle or a pentagon in another embodiment. Also, although a flat-panel display apparatus is illustrated in FIG. 1, the display apparatus 1 may be implemented in various forms, such as a flexible, foldable, and/or rollable display apparatus in another embodiment.

Although an organic light-emitting display apparatus is described as an example of the display apparatus according to the embodiment, the display apparatus according to the disclosure of the invention is not limited thereto. In another embodiment, the display apparatus 1 according to the disclosure may be an inorganic light-emitting display, an inorganic electroluminescence ("EL") display, or a quantum dot light-emitting display. For example, an emission layer of a display element provided in the display apparatus 1 may include an organic material, may include an inorganic material, may include quantum dots, may include an organic material and quantum dots, may include an inorganic material and quantum dots, or may include an organic material, an inorganic material, and quantum dots.

A plurality of pixels PX may be arranged in the display area DA. Hereinafter, in this specification, the pixels PX refer to sub-pixels that emit light of different colors, and the pixels PX may each be, for example, one of a red (R) sub-pixel, a green (G) sub-pixel, and a blue (B) sub-pixel.

Figure 2:
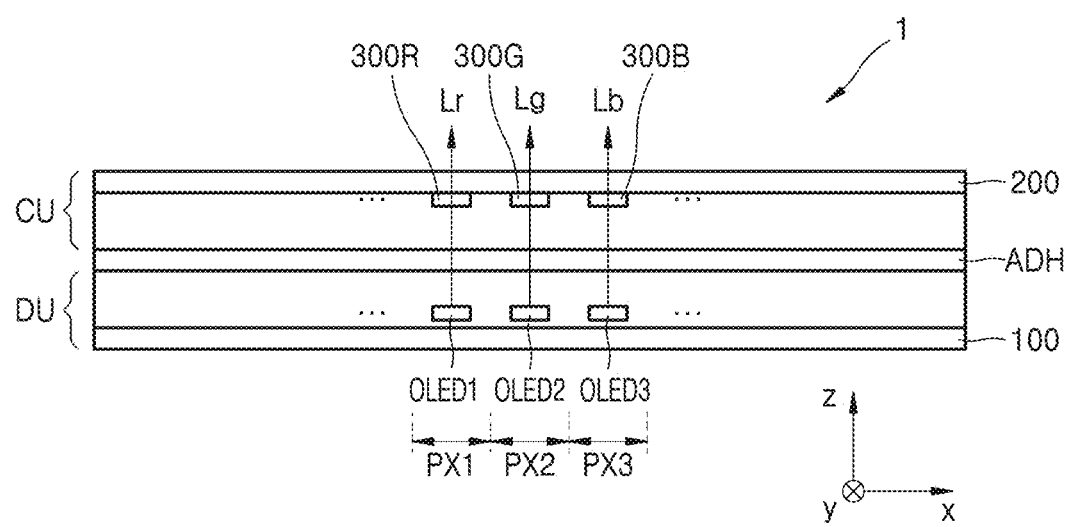
FIG. 2 is a schematic cross-sectional view of a display apparatus according to an embodiment.

FIG. 2 is a schematic cross-sectional view of a display apparatus 1 according to an embodiment.

Referring to FIG. 2, the display apparatus 1 may include a display unit DU, and a color filter unit CU arranged to face the display unit DU. The display unit DU may include a first pixel PX1, a second pixel PX2, and a third pixel PX3, which are arranged on a lower substrate 100. The first pixel PX1, the second pixel PX2, and the third pixel PX3 may be pixels that emit light of different colors on the lower substrate 100, respectively. For example, the first pixel PX1 may emit red light Lr, the second pixel PX2 may emit green light Lg, and the third pixel PX3 may emit blue light Lb.

The first pixel PX1, the second pixel PX2, and the third pixel PX3 may include a first light-emitting device OLED1, a second light-emitting device OLED2, and a third light-emitting device OLED3, each including an organic light-emitting diode ("OLED"), respectively. In an embodiment, the first light-emitting device OLED1, the second light-emitting device OLED2, and the third light-emitting device OLED3 may emit the blue light Lb. In another embodiment, the first light-emitting device OLED1, the second light-emitting device OLED2, and the third light-emitting device OLED3 may emit the red light Lr, the green light Lg, and the blue light Lb, respectively.

The color filter unit CU may include filters 300R, 300G, and 300B. The light from the first light-emitting device OLED1, the light from the second light-emitting device OLED2, and the light from the third light-emitting device OLED3 may be emitted as the red light Lr, the green light Lg, and the blue light Lb through the filters 300R, 300G, and 300B, respectively.

The filters 300R, 300G, and 300B may be located directly on an upper substrate 200. The filter 300R may include a first color quantum dot layer 220R and a first color filter layer 210R illustrated in FIG. 3, the filter 300G may include a second color quantum dot layer 220G and a second color filter layer 210G illustrated in FIG. 3, and the filter 300B may include a transmissive layer 220B and a third color filter layer 210B illustrated in FIG. 3.

Here, the phrase "located directly on an upper substrate 200" means that the first to third color filter layers 210R, 210G, and 210B are disposed directly on the upper substrate 200 to provide the color filter unit CU. Thereafter, the first color filter layer 210R, the second color filter layer 210G, and the third color filter layer 2106 may be arranged to face the first pixel PX1, the second pixel PX2, and the third pixel PX3, respectively, and the display unit DU and the color filter unit CU may be bonded to each other.

FIG. 2 illustrates that the display unit DU and the color filter unit CU are bonded to each other through an adhesive layer ADH. The adhesive layer ADH may be, for example, an optical clear adhesive ("OCA"), but the kind of adhesive according to the invention is not necessarily limited thereto. In another embodiment, the adhesive layer ADH may be omitted.

Figure 3:
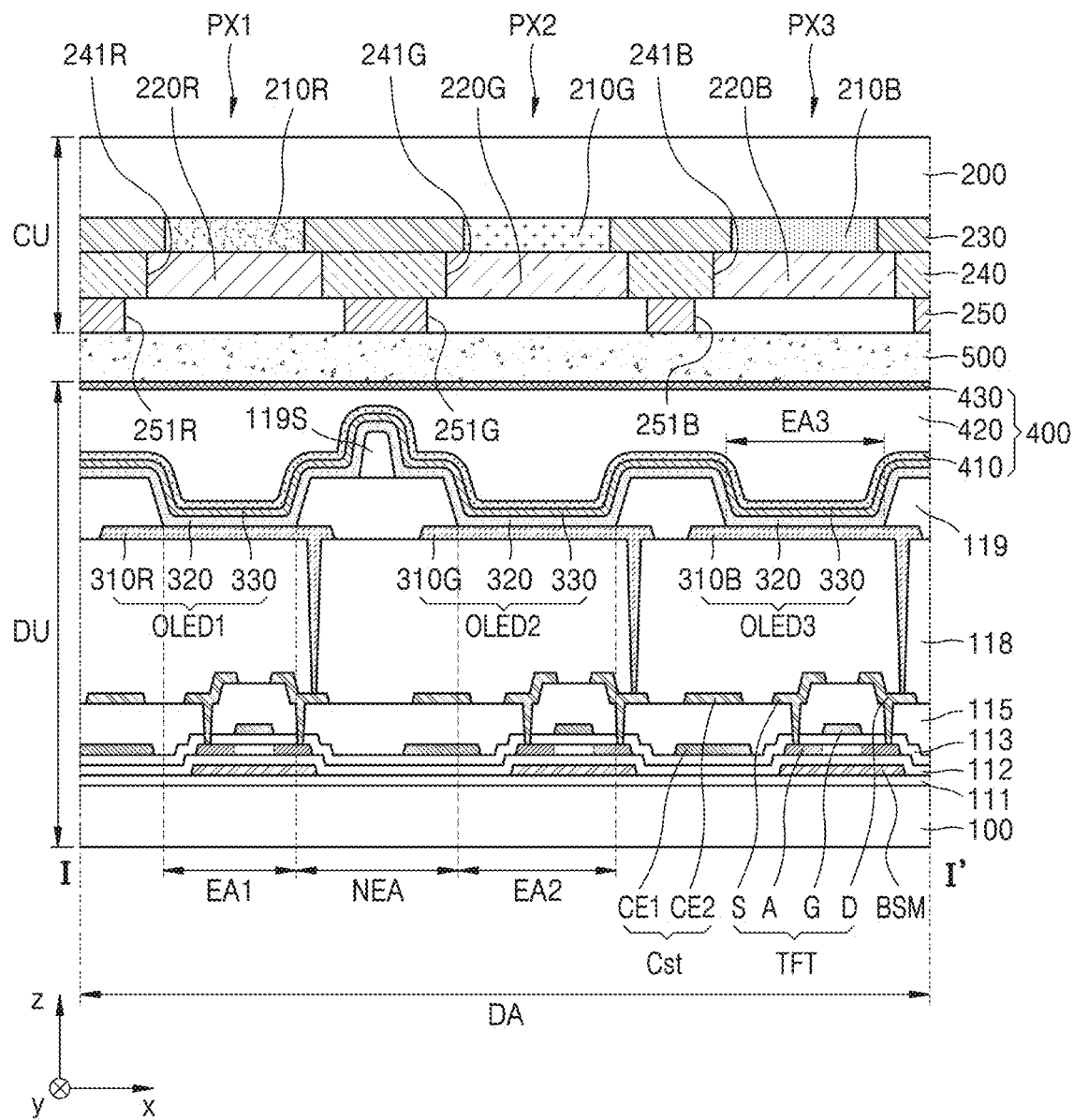
FIG. 3 is a schematic cross-sectional view of a display apparatus according to an embodiment.

FIG. 3 is a schematic cross-sectional view of a display apparatus 1 according to an embodiment and schematically illustrates a cross-section taken along line I-I' of FIG. 1.

Referring to FIG. 3, at least one thin-film transistor TFT and a display element connected to the thin-film transistor TFT may be arranged on the display area DA of the display apparatus 1 according to the embodiment.

The display area DA of the display apparatus 1 according to the embodiment includes the first to third pixels PX1, PX2, and PX3. This is just an example, and the display apparatus 1 may include more pixels. Although FIG. 3 illustrates that the first to third pixels PX1, PX2, and PX3 are adjacent to each other, the disclosure according to the invention is not limited thereto. That is, elements such as other lines may be arranged between the first to third pixels PX1, PX2, and PX3. Therefore, for example, the first pixel PX1 and the second pixel PX2 may not be pixels that are located adjacent to each other. Also, the cross-sections of the first to third pixels PX1, PX2, and PX3 in FIG. 3 may not be cross-sections of the same direction in another embodiment.

The first to third pixels PX1, PX2, and PX3 may include first to third emission areas EA1, EA2, and EA3, respectively. The first to third emission areas EA1, EA2, and EA3 may be areas in which light is generated and emitted to the outside. Non-emission areas NEA may be arranged between the first to third emission areas EA1, EA2, and EA3, and the first to third emission areas EA1, EA2, and EA3 may be distinguished by the non-emission areas NEA therebetween.

The first to third pixels PX1, PX2, and PX3 may implement light of different colors. For example, the first pixel PX1 may emit red light Lr, the second pixel PX2 may emit green light Lg, and the third pixel PX3 may emit blue light Lb. In a plan view, the first to third emission areas EA1, EA2, and EA3 may have various polygonal shapes or a circular shape. Also, the first to third emission areas EA1, EA2, and EA3 may have various arrangements such as a stripe arrangement and a pentile arrangement.

The display apparatus 1 according to the embodiment may include the first color quantum dot layer 220R, the second color quantum dot layer 220G, and the transmissive layer 220B corresponding to the first to third emission areas EA1, EA2, and EA3, respectively. The first color quantum dot layer 220R, the second color quantum dot layer 220G, and the transmissive layer 220B may each include quantum dots and metal nanoparticles.

For example, the first pixel PX1 may include the first color quantum dot layer 220R, the second pixel PX2 may include the second color quantum dot layer 220G, and the third pixel PX3 may include the transmissive layer 220B.

In the present embodiment, the average sizes of the quantum dots included in the first color quantum dot layer 220R and the average sizes of the quantum dots included the second color quantum dot layer 220G may be different from each other.

Hereinafter, the display apparatus 1 according to the embodiment will be described in detail according to the stacking order illustrated in FIG. 3.

The lower substrate 100 may include a glass material, a ceramic material, a metal material, or a flexible or bendable material. When the lower substrate 100 is flexible or bendable, the lower substrate 100 may include a polymer resin, such as polyethersulfone, polyacrylate, polyetherimide, polyethylene naphthalate, polyethyelene terephthalate, polyphenylene sulfide, polyarylate, polyimide, polycarbonate, or cellulose acetate propionate. The lower substrate 100 may have a single-layered or multi-layered structure including the above-described material. In the case of the multi-layered structure, the lower substrate 100 may further include an inorganic layer. In an embodiment, the lower substrate 100 may have an organic/inorganic/organic structure.

A barrier layer (not illustrated) may be further included between the lower substrate 100 and a first buffer layer 111. The barrier layer may serve to prevent or minimize impurities from penetrating from the lower substrate 100 or the like into a semiconductor layer A. The barrier layer may include an inorganic material such as oxide or nitride, an organic material, or an organic/inorganic composite and may have a single-layered structure or a multi-layered structure including an inorganic material and an organic material.

A bias electrode BSM corresponding to the thin-film transistor TFT may be arranged on the first buffer layer 111. A voltage may be applied to the bias electrode BSM. Also, the bias electrode BSM may be opaque and therefore, may serve to prevent external light from reaching the semiconductor layer A. Therefore, characteristics of the thin-film transistor TFT may be stabilized. In some cases, the bias electrode BSM may be omitted.

The semiconductor layer A may be arranged on a second buffer layer 112. The semiconductor layer A may include amorphous silicon or polycrystalline silicon. In another embodiment, the semiconductor layer A may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer A may include a Zn oxide-based material such as Zn oxide, In—Zn oxide, and Ga—In—Zn oxide. In another embodiment, the semiconductor layer A may include In—Ga—Zn—O ("IGZO"), In—Sn—Zn—O ("ITZO"), or In—Ga—Sn—Zn—O ("IGTZO") semiconductor, in which a metal such as indium (In), gallium (Ga), or stannum (Sn) is included in ZnO. The semiconductor layer A may include a channel region, and a source region and a drain region which are arranged on both sides of the channel region, respectively. The semiconductor layer A may include a single layer or a multi-layer.

A gate electrode G may be arranged on the semiconductor layer A, with a gate insulating layer 113 therebetween, so as to at least partially overlap the semiconductor layer A. The gate electrode G may include molybdenum (Mo), aluminum (Al), copper (Cu), titanium (Ti), or the like and may include a single layer or a multi-layer. For example, the gate electrode G may include a single Mo layer. A first electrode CE1 of a storage capacitor Cst may be arranged in the same layer as the gate electrode G. The first electrode CE1 may include the same material as the material of the gate electrode G.

Although FIG. 3 illustrates that the gate electrode G of the thin-film transistor TFT and the first electrode CE1 of the storage capacitor Cst are separately arranged, the storage capacitor Cst may overlap the thin-film transistor TFT and the gate electrode G of the thin-film transistor TFT may function as the first electrode CE1 of the storage capacitor Cst in another embodiment.

An interlayer insulating layer 115 may be provided to cover the gate electrode G of the thin-film transistor TFT and the first electrode CE1 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide ($ZnO_2$).

A second electrode CE2 of the storage capacitor Cst, a source electrode S, and a drain electrode D may be arranged on the interlayer insulating layer 115.

The second electrode CE2 of the storage capacitor Cst, the source electrode S, and the drain electrode D may each include a conductive material including molybdenum (Mo), aluminum (Al), copper (Cu), titanium (Ti), and the like and may each include a single layer or a multi-layer including the above-described material. For example, the second electrode CE2, the source electrode S, and the drain electrode D may each have a multi-layered structure of Ti/Al/Ti. The source electrode S and the drain electrode D may be connected to the source region or the drain region of the semiconductor layer A through contact holes.

The second electrode CE2 of the storage capacitor Cst may overlap the first electrode CE1 with the interlayer insulating layer 115 therebetween and may form a capacitance. In this case, the interlayer insulating layer 115 may function as a dielectric layer of the storage capacitor Cst.

A planarization layer 118 may be arranged on the second electrode CE2 of the storage capacitor Cst, the source electrode S, and the drain electrode D, and first to third light-emitting devices OLED1, OLED2, and OLED3 may be arranged on the planarization layer 118.

The planarization layer 118 may include a single layer or a multi-layer including an organic material and may provide a flat upper surface. The planarization layer 118 may include a general-purpose polymer (for example, benzocyclobutene ("BCB"), polyimide, hexamethyldisiloxane ("HMDSO"), polymethylmethacrylate ("PMMA"), or polystyrene ("PS")), a polymer derivative having a phenol-based group, an acryl-based polymer, an imide-based polymer, an aryle-ther-based polymer, an amide-based polymer, a fluorine-based polymer, a p-xylene-based polymer, a vinyl alcohol-based polymer, and any blend thereof.

In the display area DA of the lower substrate 100, the first to third light-emitting devices OLED1, OLED2, and OLED3 may be arranged on the planarization layer 118. The first to third light-emitting devices OLED1, OLED2, and OLED3 may include first to third pixel electrodes 310R, 310G, and 310B, respectively, and may commonly include an intermediate layer 320 and an opposite electrode 330.

The intermediate layer 320 may include an organic emission layer.

The first to third pixel electrodes 310R, 310G, and 310B may each include a (semi)transmissive electrode or a reflective electrode. In some embodiments, the first to third pixel electrodes 310R, 310G, and 310B may include a reflective layer, and a transparent or semitransparent electrode layer arranged on the reflective layer. The reflective layer may include Ag, Mg, Al, Pt, Pd, Au, Ni, Nd, Ir, Cr, or any compound thereof. The transparent or semitransparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In some embodiments, the first to third pixel electrodes 310R, 310G, and 310B may each include ITO/Ag/ITO.

A pixel defining layer 119 may be arranged on the planarization layer 118. Also, the pixel defining layer 119 may increase a distance between each of the edges of the first to third pixel electrodes 310R, 310G, and 310B and the opposite electrode 330 above the first to third pixel electrodes 310R, 310G, and 310B, thereby preventing arcs or the like from occurring at the edges of the first to third pixel electrodes 310R, 310G, and 310B.

The pixel defining layer 119 may include at least one organic insulating material selected from polyimide, polyamide, an acrylic resin, benzocyclobutene, and a phenol resin and may be formed by spin coating or the like.

The intermediate layers 320 of the first to third light-emitting devices OLED1, OLED2, and OLED3 may include an organic emission layer. The organic emission layer may include an organic material including a fluorescent or phosphorescent material that emits red, green, blue, or white light. The organic emission layer may include a low-molecular-weight organic material or a high-molecular-weight organic material. Functional layers such as a hole transport layer ("HTL"), a hole injection layer ("HIL"), an electron transport layer ("ETL"), and an electron injection layer ("EIL") may optionally be further arranged below and above the organic emission layer. Although FIG. 3 illustrates that the intermediate layers 320 are integrally formed over the first to third pixel electrodes 310R, 310G, and 310B, but the disclosure according to the invention is not limited thereto. The intermediate layers 320 may be variously modified. In another embodiment, for example, the intermediate layers 320 may be arranged to correspond to the first to third pixel electrodes 310R, 310G, and 310B, respectively.

The intermediate layers 320 may include the layer integrally formed over the first to third pixel electrodes 310R, 310G, and 310B as described above, but in some cases, the intermediate layers 320 may include layers patterned to correspond to the first to third pixel electrodes 310R, 310G, and 310B, respectively. In any case, the intermediate layers 320 include first color emission layers. The first color emission layers may be integrally formed over the first to third pixel electrodes 310R, 310G, and 310B, but in some cases, the first color emission layers may be patterned to correspond to the first to third pixel electrodes 310R, 310G, and 310B, respectively. The first color emission layer may emit light of a first wavelength band of, for example, about 450 nanometers (nm) to about 495 nm.

The opposite electrodes 330 may be arranged on the intermediate layers 320 to correspond to the first to third pixel electrodes 310R, 310G, and 310B. The opposite electrodes 330 may be integrally formed with a plurality of organic light-emitting devices. In some embodiments, the opposite electrode 330 may include a transparent or semi-transparent electrode and may include a metal thin-film that has a low work function and includes Li, Ca, LiF/Ca, LiF/Al, Al, Ag, Mg, or any compound thereof. Also, a transparent conductive oxide ("TCO") layer such as ITO, IZO, ZnO, or $In_2O_3$ may be further arranged on the metal thin-film.

A spacer 119S may be further provided on the pixel defining layer 119 for preventing a mask dent. The spacer 119S may be integrally formed with the pixel defining layer 119. For example, the spacer 119S and the pixel defining layer 119 may be simultaneously formed in the same process using a half-tone mask process.

Because the first to third light-emitting devices OLED1, OLED2, and OLED3 may be easily damaged by external moisture or oxygen, a thin-film encapsulation layer 400 may cover and protect the first to third light-emitting devices OLED1, OLED2, and OLED3. The thin-film encapsulation layer 400 may cover the display area DA and extend to the outside of the display area DA. The thin-film encapsulation layer 400 may include at least one organic encapsulation layer and at least one inorganic encapsulation layer. For example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include silicon oxide, silicon nitride, and/or silicon trioxynitride. Although not illustrated, other layers such as a capping layer may be arranged between the first inorganic encapsulation layer 410 and the opposite electrode 330. Because the first inorganic encapsulation layer 410 is formed along an underlying structure thereof, the upper surface of the first inorganic encapsulation layer 410 may not be flat. The organic encapsulation layer 420 may cover the first inorganic encapsulation layer 410. Unlike the first inorganic encapsulation layer 410, the upper surface of the organic encapsulation layer 420 may be substantially flat.

Even when cracks occur in the thin-film encapsulation layer 400, the above-described multi-layered structure of the thin-film encapsulation layer 400 may prevent these cracks from being connected between the first inorganic encapsulation layer 410 and the organic encapsulation layer 420 or between the organic encapsulation layer 420 and the second inorganic encapsulation layer 430. Therefore, the formation of a passage through which external moisture or oxygen penetrates into the display area DA may be prevented or minimized.

The upper substrate 200 may be located above the lower substrate 100, and the opposite electrode 330 may be arranged between the upper substrate 200 and the lower substrate 100. The upper substrate 200 may include a glass, a metal, or a polymer resin. When the upper substrate 200 is flexible or bendable, the upper substrate 200 may include a polymer resin, such as polyethersulfone, polyacrylate, polyetherimide, polyethylene naphthalate, polyethyelene terephthalate, polyphenylene sulfide, polyarylate, polyimide, polycarbonate, or cellulose acetate propionate. The upper substrate 200 may be variously modified. For example, the upper substrate 200 may have a multi-layered structure that includes two layers each including the above-described polymer resin, and a barrier layer arranged between the two layers and includes an inorganic material (e.g., silicon oxide, silicon nitride, silicon oxynitride, or the like).

A light blocking layer 230 may be arranged on the lower surface of the upper substrate 200 in the direction of the lower substrate 100. The light blocking layer 230 may define openings corresponding to the first to third light-emitting devices OLED1, OLED2, and OLED3, respectively. The first to third color filter layers 210R, 210G, and 210B may be located in the openings, respectively. The light blocking layer 230 is a black matrix and may be a layer for improving color sharpness and contrast. The light blocking layer 230 may include at least one of black pigment, black dye, or black particles. In some embodiments, the light blocking layer 230 may include Cr or $CrO_X$, $Cr/CrO_X$, $Cr/CrO_X/CrN_Y$, a resin (carbon pigment, RGB mixed pigment), graphite, and non-Cr-based materials.

The first color filter layer 210R may transmit only light of a wavelength of about 630 nm to about 780 nm, the second color filter layer 210G may transmit only light of a wavelength of about 495 nm to about 570 nm, and the third color filter layer 210B may transmit only light of a wavelength of about 450 nm to about 495 nm. The first to third color filter layers 210R, 210G, and 210B may serve to reduce external light reflection in the display apparatus 1.

For example, when external light reaches the first color filter layer 210R, the first color filter layer 210R transmits only light of a preset wavelength as described above and absorbs light of the other wavelengths from the external light. Therefore, only the light of the preset wavelength as described above among the external lights incident on the display apparatus 1 passes through the first color filter layer 210R. The external light of the preset wavelength is reflected from the opposite electrode 330 or the first pixel electrode 310R below the first color filter layer 210R and emitted again to the outside. Consequently, because only part of the external lights incident on the first pixel PX1 is reflected to the outside, the external light reflection may be reduced. This description may also be applied to the second color filter layer 210G and the third color filter layer 210B.

A first insulating layer 240 may be arranged on the light blocking layer 230. The first insulating layer 240 may define a $(1-1)^{st}$ opening 241R corresponding to the first light-emitting device OLED1, a $(1-2)^{nd}$ opening 241G corresponding to the second light-emitting device OLED2, and a $(1-3)^{rd}$ opening 241B corresponding to the third light-emitting device OLED3. The first color quantum dot layer 220R may be located in the $(1-1)^{st}$ opening 241R, the second color quantum dot layer 220G may be located in the $(1-2)^{nd}$ opening 241G, and the transmissive layer 220B may be located in the $(1-3)^{rd}$ opening 241B. The first color quantum dot layer 220R and the second color quantum dot layer 220G may be formed by ink-jet printing.

The first insulating layer 240 may include, for example, an organic material. In some cases, the first insulating layer 240 may include a light blocking material so as to function as a light blocking layer. The light blocking material may include, for example, at least one of black pigment, black dye, black particles, or metal particles. In an embodiment, the first insulating layer 240 may be blue.

The first color quantum dot layer 220R may convert light of a first wavelength band, which is generated in the intermediate layer 320 on the first pixel electrode 310R, into light of a second wavelength band. For example, when light of a wavelength of about 450 nm to about 495 nm is generated in the intermediate layer 320 on the first pixel electrode 310R, the first color quantum dot layer 220R may convert the generated light into light of a wavelength of about 630 nm to about 780 nm. Therefore, in the first pixel PX1, light of a wavelength of about 630 nm to about 780 nm is emitted to the outside through the upper substrate 200.

The second color quantum dot layer 220G may convert light of a first wavelength band, which is generated in the intermediate layer 320 on the second pixel electrode 310G, into light of a third wavelength band. For example, when light of a wavelength of about 450 nm to about 495 nm is generated in the intermediate layer 320 on the second pixel electrode 310G, the second color quantum dot layer 220G may convert the generated light into light of a wavelength of about 495 nm to about 570 nm. Therefore, in the second pixel PX2, light of a wavelength of about 495 nm to about 570 nm is emitted to the outside through the upper substrate 200.

In the first color quantum dot layer 220R and the second color quantum dot layer 220G, quantum dots may be dispersed in a resin. The quantum dots may include semiconductor materials such as cadmium sulfide (CdS), cadmium telluride (CdTe), zinc sulfide (ZnS), or indium phosphide (InP). The size of the quantum dots may be several nanometers, and the wavelength of light after conversion may be different according to the size of the quantum dots. The resin included in the first color quantum dot layer 220R and the second color quantum dot layer 220G may include any transparent material. For example, a polymer resin such as acryl, benzocyclobutene (BCB) or hexamethyldisiloxane (HMDSO) may be used as a material for the first color quantum dot layer 220R and the second color quantum dot layer 220G.

In the third pixel PX3, light of the first wavelength, which is generated in the intermediate layer 320, may be emitted to the outside without wavelength conversion. Therefore, the third pixel PX3 may not have a quantum dot layer. As such, because the quantum dot layer may not be required in the $(1-3)^{rd}$ opening 241B, the transmissive layer 220B including the transmissive resin without the quantum dot may be located. The transmissive layer 220B may include acryl, benzocyclobutene (BCB), or hexamethyldisiloxane (HMDSO). In some cases, unlike those illustrated in FIG. 3, the transmissive layer 220B may not be present in the $(1-3)^{rd}$ openings 241B.

In the display apparatus 1 according to the embodiment, the light of the second wavelength band may be emitted to the outside from the first pixel PX1, the light of the third wavelength band may be emitted to the outside from the second pixel PX2, and light of the first wavelength band may be emitted to the outside from the third pixel PX3. Therefore, the display apparatus 1 according to the embodiment may display a full color image by combining the lights of first, second, and third wavelengths.

A second insulating layer 250 may be arranged on the first insulating layer 240. The second insulating layer 250 may define a $(2-1)^{st}$ opening 251R corresponding to the $(1-1)^{st}$ opening 241R, a $(2-2)^{nd}$ opening 251G corresponding to the $(1-2)^{nd}$ opening 241G, and a $(2-3)^{rd}$ openings 251B corresponding to the $(1-3)^{rd}$ opening 241B.

The first color quantum dot layer 220R and the second color quantum dot layer 220G, which are located in the $(1-1)^{st}$ opening 241R and the $(1-2)^{nd}$ opening 241G, respectively, may be formed by ink-jet printing. The $(2-1)^{st}$ opening 251R and the $(2-2)^{nd}$ opening 251G may be passages through which ink sprayed by a nozzle drops and moves during ink-jet printing. The ink moved through the second insulating layer 250 including the $(2-1)^{st}$ opening 251R and the $(2-2)^{nd}$ opening 251G may reach the $(1-1)^{st}$ opening 241R and the $(1-2)^{nd}$ opening 241G to form the first color quantum dot layer 220R and the second color quantum dot layer 220G.

The second insulating layer 250 may include a light blocking material. The light blocking material may include, for example, at least one of black pigment, black dye, black particles, or metal particles. Also, in an embodiment, the second insulating layer 250 may be blue. As described above, the first insulating layer 240 may also include a light blocking material, but materials for forming the first insulating layer 240 and the second insulating layer 250 may be different from each other so as to form the first color quantum dot layer 220R and the second color quantum dot layer 220G through ink-jet printing.

For example, the second insulating layer 250, which is the passage through which ink sprayed by the nozzle moves during ink-jet printing, may include a material that is not compatible with ink. Also, the first insulating layer 240, on which ink is accumulated to form the first color quantum dot layer 220R and the second color quantum dot layer 220G, may include a material that is compatible with ink.

Although FIG. 3 illustrates both the first insulating layer 240 and the second insulating layer 250, the second insulating layer 250 may be omitted in another embodiment. Only the first insulating layer 240 may be arranged on the upper substrate 200 in the embodiment.

A filler 500 may be further arranged between the lower substrate 100 and the upper substrate 200. The filler 500 may act as a buffer against external pressure. The filler 500 may include an organic material such as methyl silicone, phenyl silicone, or polyimide. However, the disclosure according to the invention is not limited thereto, and the filler 500 may include an organic sealant such as a urethane-based resin, an epoxy-based resin, and an acryl-based resin, or an inorganic sealant such as silicone in another embodiment.

Figure 4:
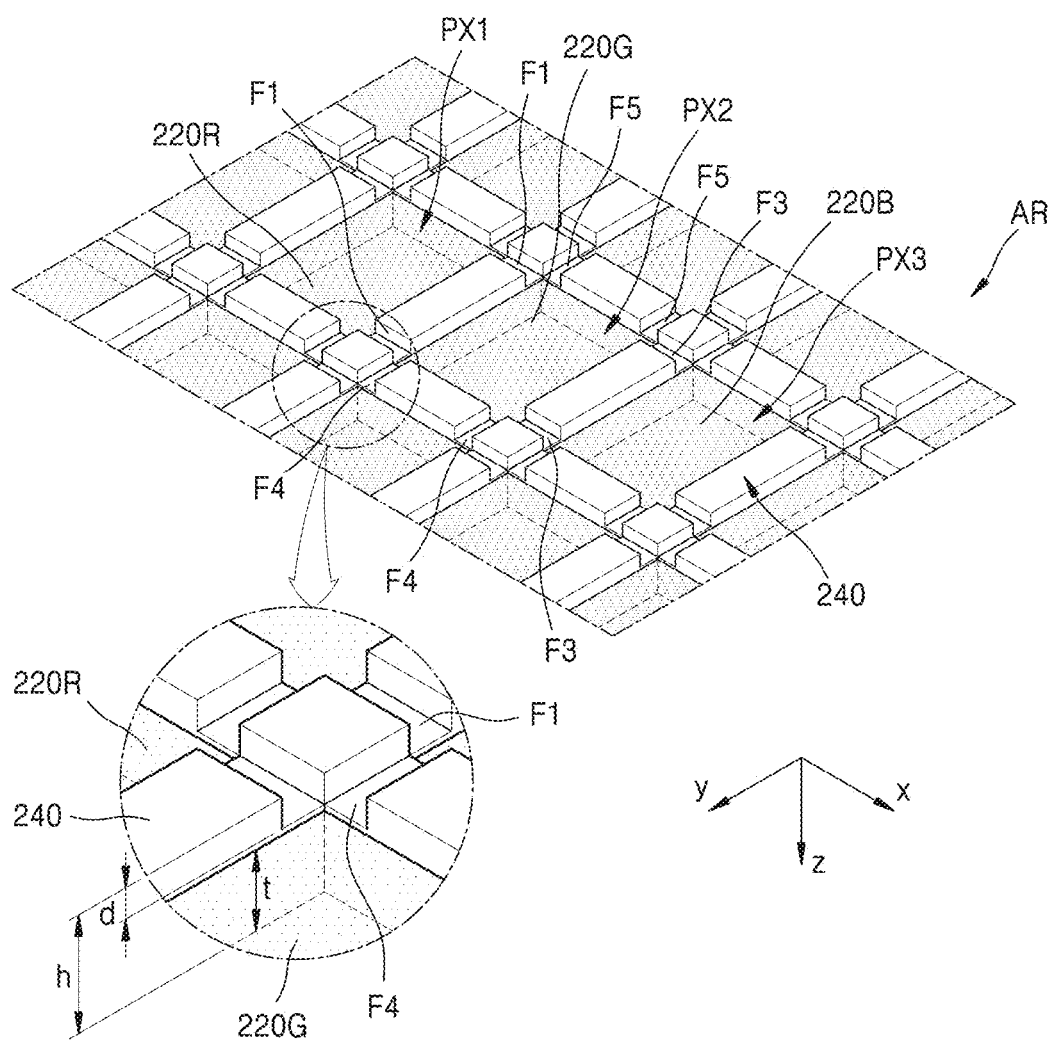
FIG. 4 is a schematic perspective view of a color filter unit according to an embodiment.
Figure 5:
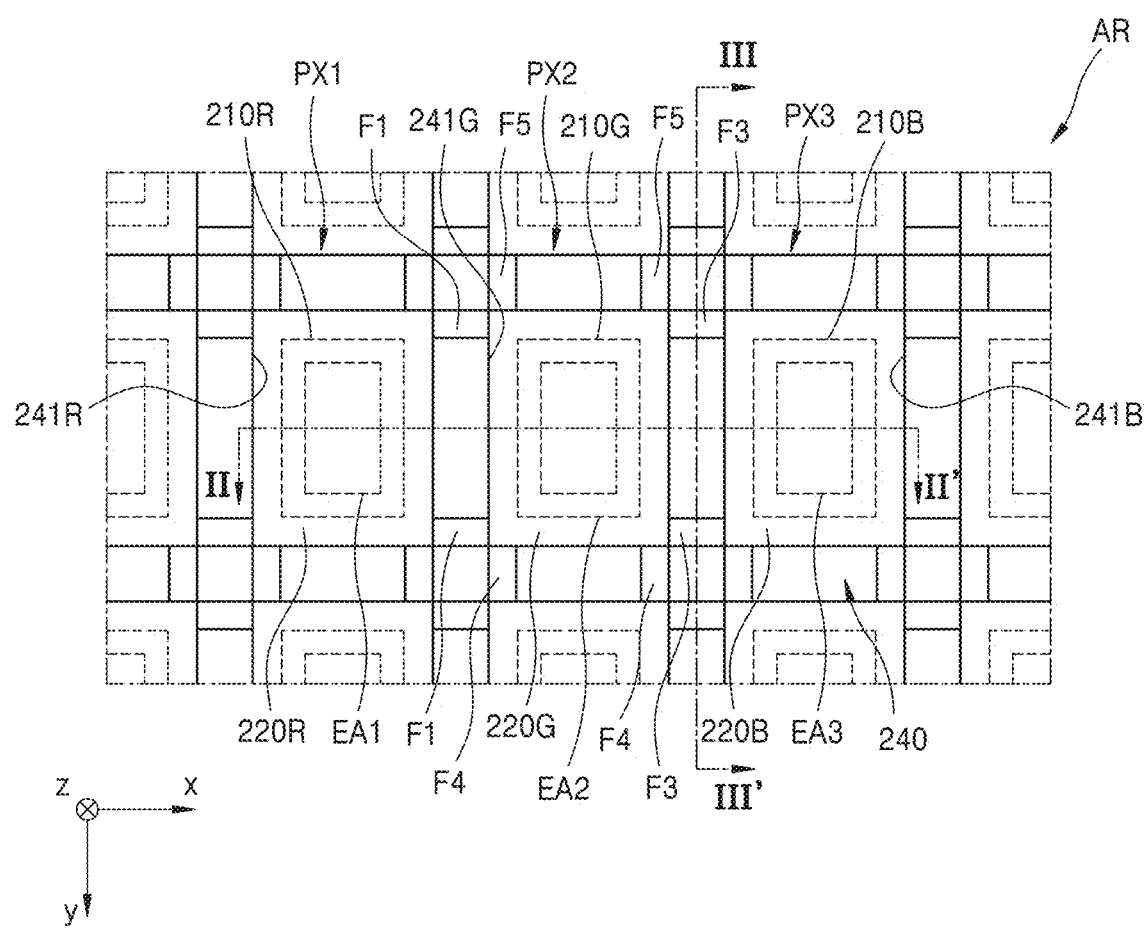
FIG. 5 is a schematic bottom view of a color filter unit according to an embodiment.
Figure 6A:
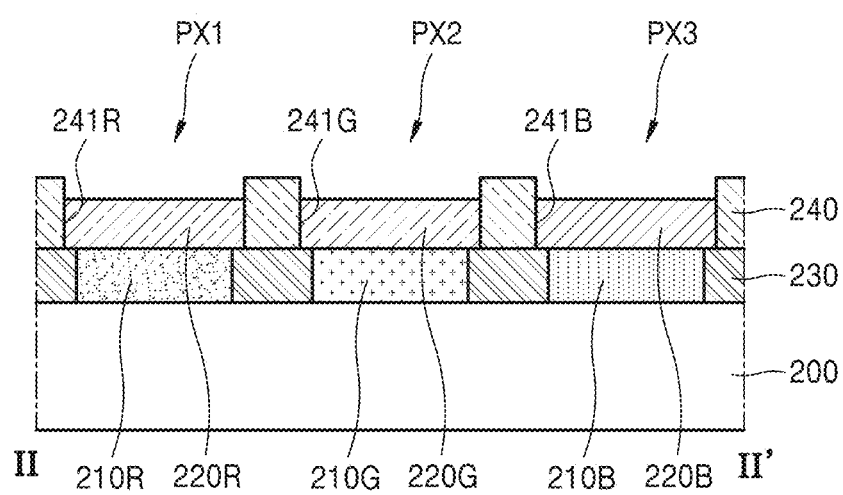
FIGS. 6A and 6B are schematic cross-sectional views of a color filter unit according to an embodiment.
Figure 6B:
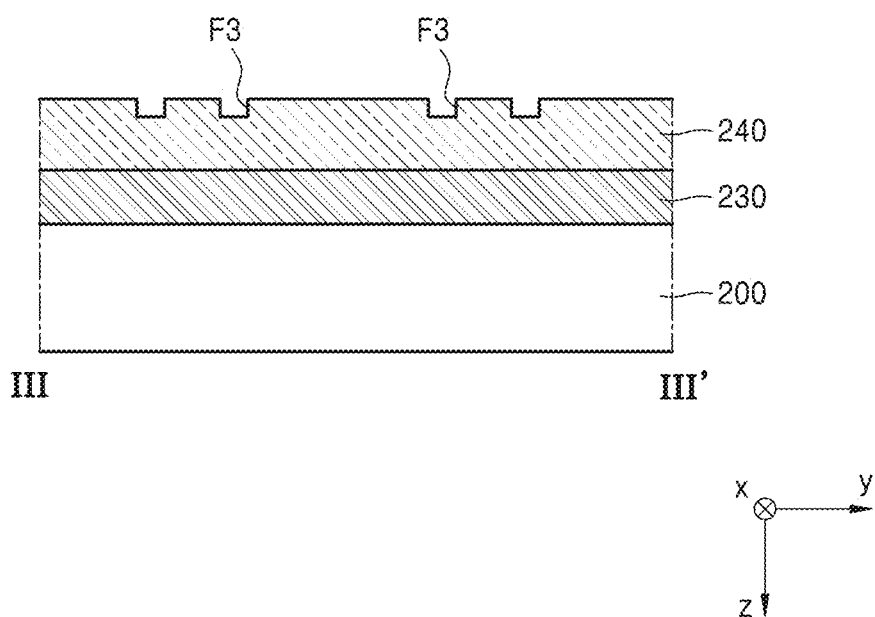

FIG. 4 is a schematic perspective view of a color filter unit according to an embodiment, and FIG. 5 is a schematic bottom view of a color filter unit according to an embodiment and is a schematic enlarged view of a color filter unit CU corresponding to a partial region AR of FIG. 1. FIGS. 6A and 6B are schematic cross-sectional views of the color filter unit according to an embodiment. FIG. 6A schematically illustrates a cross-section taken along line II-II' of FIG. 5, and FIG. 6B schematically illustrates a cross-section taken along line III-III' of FIG. 5. In FIGS. 4, 5, 6A, and 6B, because the same reference numerals as those in FIG. 3 refer to the same members, a redundant description thereof will be omitted.

Referring to FIGS. 4 and 5, the display apparatus 1 according to the embodiment may include first to third pixels PX1, PX2, and PX3. This is just an example, and the display apparatus 1 may include more pixels as illustrated in FIGS. 4 and 5. The first to third pixels PX1, PX2, and PX3 may include first to third light-emitting devices OLED1, OLED2, and OLED3 (see FIG. 3) such as OLEDs, respectively. The first to third pixels PX1, PX2, and PX3 may emit, for example, red, green, blue, or white light through the first to third light-emitting devices OLED1, OLED2, and OLED3, respectively.

The first to third pixels PX1, PX2, and PX3 may include first to third emission areas EA1, EA2, and EA3, respectively. The first to third emission areas EA1, EA2, and EA3 may be areas in which light is generated and emitted to the outside. As illustrated in FIG. 5, the first to third emission areas EA1, EA2, and EA3 may have a rectangular shape. The shapes of the first to third emission areas EA1, EA2, and EA3 may be variously changed. For example, the first to third emission areas EA1, EA2, and EA3 may have a polygonal shape such as a circle or an ellipse, a star shape, or a diamond shape in another embodiment.

Referring to FIG. 6A, a light blocking layer 230 defining a plurality of openings may be arranged on an upper substrate 200, and first to third color filter layers 210R, 210G, and 210B may be arranged in the openings, respectively. A first insulating layer 240 defining a $(1-1)^{st}$ opening 241R corresponding to the first emission area EA1, a $(1-2)^{nd}$ opening 241G corresponding to the second emission area EA2, and a $(1-3)^{rd}$ opening 241B corresponding to the third emission area EA3 may be arranged on the light blocking layer 230. A first color quantum dot layer 220R may be arranged in the $(1-1)^{st}$ opening 241R, a second color quantum dot layer 220G may be arranged in the $(1-2)^{nd}$ opening 241G, and a transmissive layer 220B may be arranged in the $(1-3)^{rd}$ opening 241B.

Although FIG. 6A illustrates that various layers are stacked on the upper substrate 200 in the −z direction for convenience of description, the color filter unit CU according to the embodiment may be substantially attached to the display unit DU with the top and bottom inverted as illustrated in FIG. 3.

That is, lights emitted by the first to third light-emitting devices OLED1, OLED2, and OLED3 may pass through the first color quantum dot layer 220R, the second color quantum dot layer 220G, and the transmissive layer 220B, respectively. Also, the lights passing through the first color quantum dot layer 220R, the second color quantum dot layer 220G, and the transmissive layer 220B may pass through the first to third color filter layers 210R, 210G, and 210B, respectively. As illustrated in FIG. 5, the areas of the first to third emission areas EA1, EA2, and EA3 in a plan view may be smaller than the areas of the first to third color filter layers 210R, 210G, and 210B, respectively.

In an embodiment, as illustrated in FIGS. 4 and 5, the first insulating layer 240 may define a $(1-1)^{st}$ groove F1 connecting the $(1-1)^{st}$ opening 241R to the $(1-2)^{nd}$ opening 241G. Also, as illustrated in FIG. 6B, the first insulating layer 240 may define a $(1-3)^{rd}$ groove F3 connecting the $(1-2)^{nd}$ opening 241G to the $(1-3)^{rd}$ opening 241B. That is, the light blocking layer 230 may be arranged on the upper substrate 200, and the first insulating layer 240 defining grooves such as the $(1-3)^{rd}$ groove F3 may be arranged on the light blocking layer 230.

Although two $(1-1)^{st}$ grooves F1 and two $(1-3)^{rd}$ grooves F3 are illustrated in FIGS. 4 and 5, one $(1-1)^{st}$ groove F1 and one $(1-3)^{rd}$ groove F3 may be provided, or three or more $(1-1)^{st}$ grooves F1 and three or more $(1-3)^{rd}$ grooves F3 may be provided in another embodiment. For example, four $(1-1)^{st}$ grooves F1 and four $(1-3)^{rd}$ grooves F3 may be provided. As another example, the number of $(1-1)^{st}$ grooves F1 may be different from the number of $(1-3)^{rd}$ grooves F3. Three $(1-1)^{st}$ grooves F1 and two $(1-3)^{rd}$ grooves F3 may be provided.

A case in which the $(1-1)^{st}$ grooves F1 and the $(1-3)^{rd}$ grooves F3 are defined in the x direction in the first to third pixels PX1, PX2, and PX3 has been described, but the first insulating layer 240 may also define grooves in the y direction (i.e., a direction perpendicular to x direction in the major plane of the first insulating layer 240). That is, the pixel arranged above the second pixel PX2 in y direction may be connected to the $(1-2)^{nd}$ opening 241G corresponding to the second pixel PX2 through the $(1-5)^{th}$ groove F5. The pixel arranged below the second pixel PX2 in y direction may be connected to the $(1-2)^{nd}$ opening 241G corresponding to the second pixel PX2 through the $(1-4)^{th}$ groove F4. Although the second pixel PX2 has been described as an example, the same may apply to the other pixels such as the first pixel PX1 and the third pixel PX3.

Referring to the enlarged view of FIG. 4, the sum of a depth d of the $(1-1)^{st}$ groove F1 and a thickness t of the second color quantum dot layer 220G in z direction (i.e., a thickness direction or a direction perpendicular to the x direction and the y direction) may be less than or equal to a height h of the first insulating layer 240. When the first color quantum dot layer 220R and the second color quantum dot layer 220G are formed in the $(1-1)^{st}$ opening 241R and the $(1-2)^{nd}$ opening 241G adjacent to each other, the first color quantum dot layer 220R and the second color quantum dot layer 220G may not be mixed by the $(1-1)^{st}$ groove F1. That is, the first color quantum dot layer 220R and the second color quantum dot layer 220G may be arranged independently from each other. Although the $(1-1)^{st}$ groove F1 and the second color quantum dot layer 220G are described as an example, the same may apply to the other grooves and the other quantum dot layers.

As a comparative example, an insulating layer defining an opening in which a quantum dot layer is formed may not define a groove. In a process of attaching the color filter unit to the display unit, a filler is coated. The filler may not be uniformly spread between the color filter unit and the display unit. In this case, spots or the like may appear on an image displayed by the display apparatus.

However, the display apparatus 1 according to the embodiment may include the first insulating layer 240 arranged on the lower surface of the upper substrate 200 in the direction of the lower substrate 100. The first insulating layer 240 may define the $(1-1)^{st}$ groove F1 connecting the $(1-1)^{st}$ opening 241R corresponding to the first emission area EA1 to the $(1-2)^{nd}$ opening 241G corresponding to the second emission area EA2. In this case, when the color filter unit CU is attached to the display unit DU, the $(1-1)^{st}$ groove F1 may serve as a passage through which the filler is able to move. The flow of the filler may be facilitated through the $(1-1)^{st}$ groove F1 such that the filler is uniformly spread between the color filter unit CU and the display unit DU and the appearance of spots or the like on an image displayed by the display apparatus 1 may be prevented.

Figure 7:
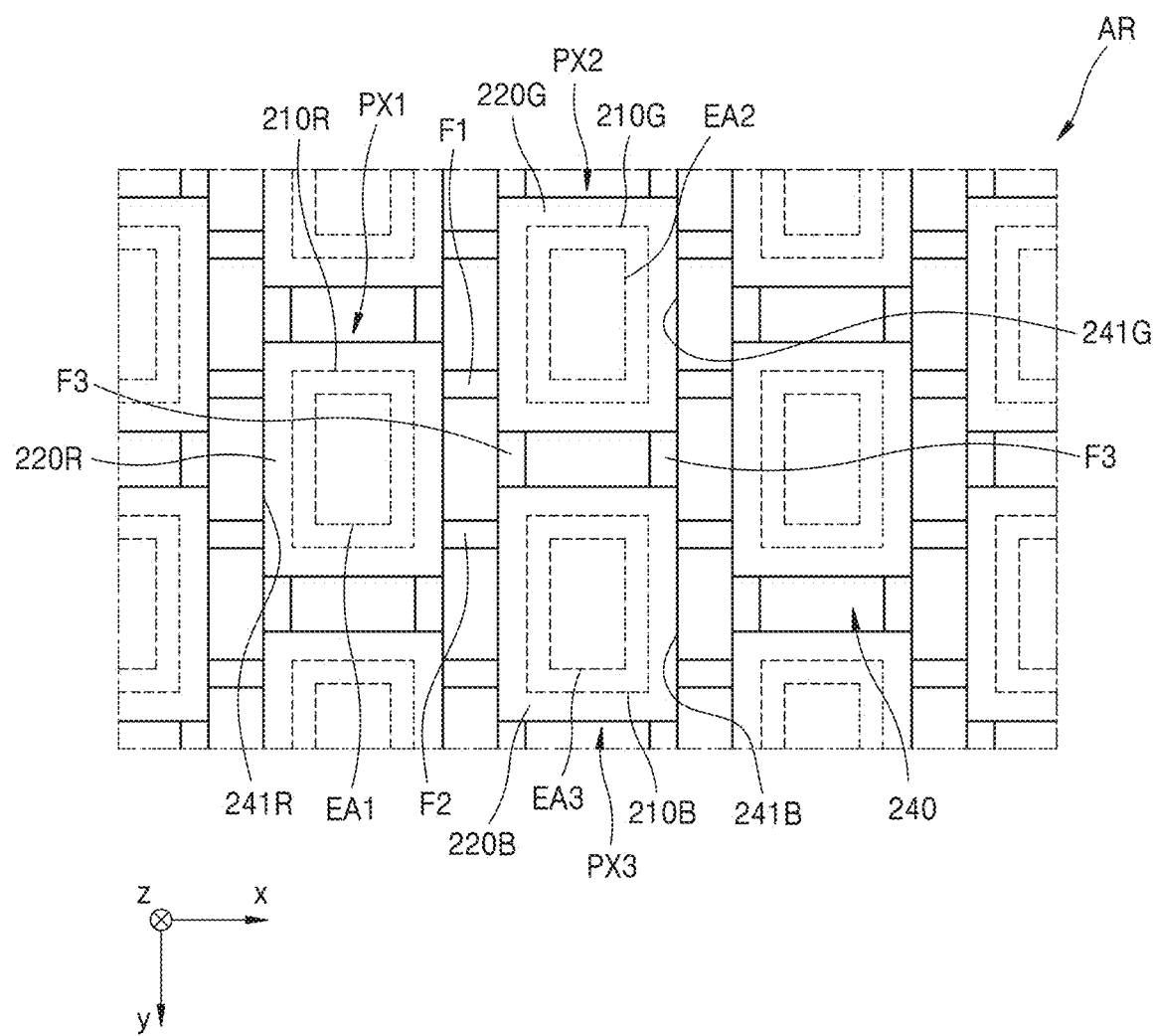
FIG. 7 is a schematic bottom view of a color filter unit according to another embodiment.

FIG. 7 is a schematic bottom view of a color filter unit according to another embodiment.

Referring to FIG. 7, first to third pixels PX1, PX2, and PX3 may not be arranged side by side and may be arranged to be offset from each other, unlike those illustrated in FIGS. 4 and 5. A first insulating layer 240 may define a $(1-1)^{st}$ opening 241R corresponding to a first emission area EA1 and a $(1-2)^{nd}$ opening 241G corresponding to a second emission area EA2 and may define a $(1-1)^{st}$ groove F1 connecting the $(1-1)^{st}$ opening 241R to the $(1-2)^{nd}$ opening 241G.

Also, the first insulating layer 240 may define a $(1-3)^{rd}$ opening 241B corresponding to a third emission area EA3 and may define a $(1-2)^{nd}$ groove F2 connecting the $(1-1)^{st}$ opening 241R to the $(1-3)^{rd}$ opening 241B. That is, the $(1-1)^{st}$ opening 241R may be connected to the $(1-2)^{nd}$ opening 241G and the $(1-3)^{rd}$ opening 241B through the $(1-1)^{st}$ groove F1 and the $(1-2)^{nd}$ groove F2, which are formed in the first insulating layer 240, respectively.

The first insulating layer 240 may define a $(1-3)^{rd}$ groove F3 connecting the $(1-2)^{nd}$ opening 241G to the $(1-3)^{rd}$ opening 241B. That is, the $(1-1)^{st}$ opening 241R, the $(1-2)^{nd}$ opening 241G, and the $(1-3)^{rd}$ opening 241B may be connected to each other through the $(1-1)^{st}$ groove F1, the $(1-2)^{nd}$ groove F2, and the $(1-3)^{rd}$ groove F3, which are defined in the first insulating layer 240. Although FIG. 7 illustrates one $(1-1)^{st}$ groove F1, one $(1-2)^{nd}$ groove F2, and two $(1-3)^{rd}$ grooves F3, this is just an example. The number of $(1-1)^{st}$ grooves F1, the number of $(1-2)^{nd}$ grooves F2, and the number of $(1-3)^{rd}$ grooves F3 may be variously modified.

The $(1-1)^{st}$ groove F1, the $(1-2)^{nd}$ groove F2, and the $(1-3)^{rd}$ groove F3 may serve as passages through which the filler used to attach the color filter unit CU to the display unit DU is able to move. Because the flow of the filler is facilitated through the $(1-1)^{st}$ groove F1, the $(1-2)^{nd}$ groove F2, and the $(1-3)^{rd}$ groove F3, the appearance of spots or the like on an image displayed by the display apparatus 1 may be prevented. Although the first to third pixels PX1, PX2, and PX3 have been described as an example, the other pixels may also be connected through grooves such as the $(1-1)^{st}$ groove F1, the $(1-2)^{nd}$ groove F2, and the $(1-3)^{rd}$ groove F3, as illustrated in FIG. 7.

Figure 8A:
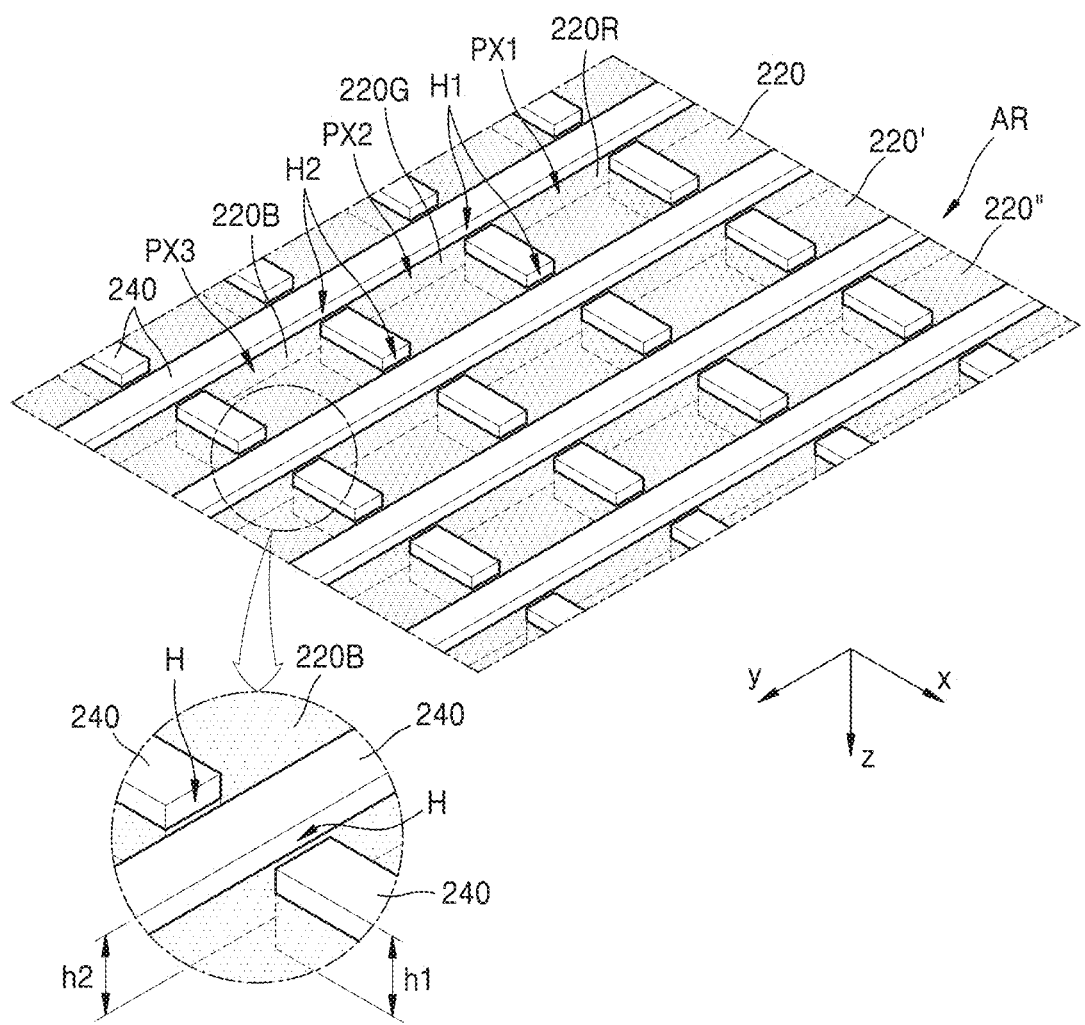
FIG. 8A is a schematic perspective view of a color filter unit according to an embodiment.
Figure 8B:
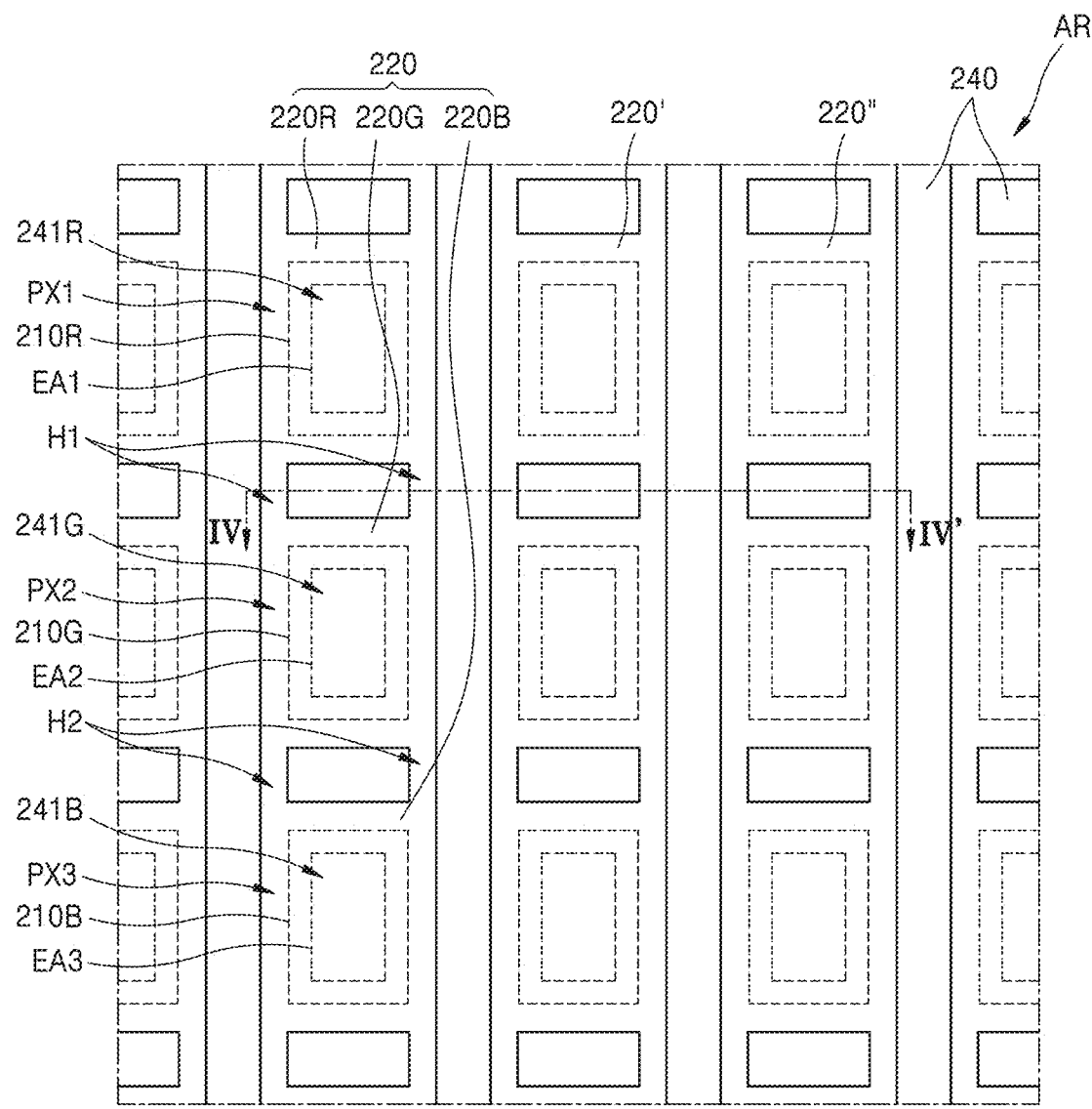
FIG. 8B is a schematic bottom view of a color filter unit according to an embodiment.
Figure 8B:
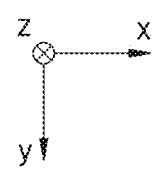
Figure 8C:
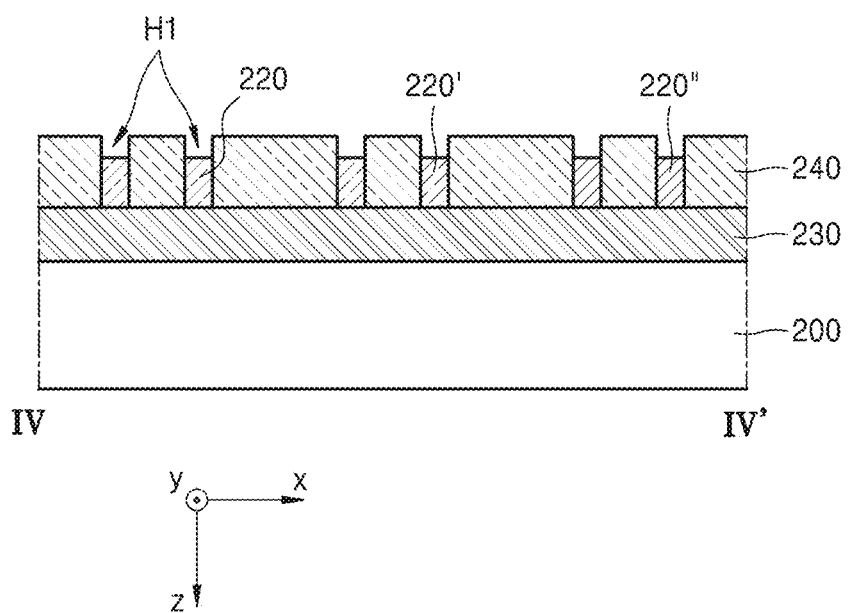
FIG. 8C is a schematic cross-sectional view of a color filter unit according to an embodiment.

FIG. 8A is a schematic perspective view of a color filter unit according to an embodiment. FIG. 8B is a schematic bottom view of a color filter unit according to an embodiment and is a schematic enlarged view of a color filter unit CU corresponding to a partial region AR of FIG. 1. FIG. 8C is a schematic cross-sectional view of a color filter unit according to an embodiment and schematically illustrates a cross-section taken along line IV-IV' of FIG. 8B. In FIGS. 8A to 8C, because the same reference numerals as those in FIG. 3 refer to the same members, a redundant description thereof will be omitted.

Referring to FIGS. 8A and 8B, the display apparatus 1 according to the embodiment may include first to third pixels PX1, PX2, and PX3. This is just an example, and the display apparatus 1 may include more pixels as illustrated in FIGS. 8A and 8B. The first to third pixels PX1, PX2, and PX3 may include first to third emission areas EA1, EA2, and EA3, respectively. The first to third emission areas EA1, EA2, and EA3 may be areas in which light is generated and emitted to the outside. As illustrated in FIG. 8B, the first to third emission areas EA1, EA2, and EA3 may have a rectangular shape. The shapes of the first to third emission areas EA1, EA2, and EA3 may be variously changed. For example, the first to third emission areas EA1, EA2, and EA3 may have a polygonal shape such as a circle or an ellipse, a star shape, or a diamond shape.

In an embodiment, a first insulating layer 240 may define a $(1\text{-}1)^{st}$ through-hole H1 connecting the $(1\text{-}1)^{st}$ opening 241R to the $(1\text{-}2)^{nd}$ opening 241G. Also, the first insulating layer 240 may define a $(1\text{-}2)^{nd}$ through-hole H2 connecting the $(1\text{-}2)^{nd}$ opening 241G to the $(1\text{-}3)^{rd}$ opening 241B.

That is, referring to FIG. 8C, a light blocking layer 230 may be arranged on an upper substrate 200, and the first insulating layer 240 defining through-holes such as the $(1\text{-}1)^{st}$ through-hole H1 may be arranged on the light blocking layer 230.

Although two $(1\text{-}1)^{st}$ through-holes H1 and two $(1\text{-}2)^{nd}$ through-holes H2 are illustrated in FIGS. 8A and 8B, one $(1\text{-}1)^{st}$ through-hole H1 and one $(1\text{-}2)^{nd}$ through-hole H2 may be provided, or three or more $(1\text{-}1)^{st}$ through-holes H1 and three or more $(1\text{-}2)^{nd}$ through-holes H2 may be provided in another embodiment. For example, four $(1\text{-}1)^{st}$ through-holes H1 and four $(1\text{-}2)^{nd}$ through-holes H2 may be provided. As another example, the number of $(1\text{-}1)^{st}$ through-holes H1 may be different from the number of $(1\text{-}2)^{nd}$ through-holes H2. Three $(1\text{-}1)^{st}$ through-holes H1 and two $(1\text{-}2)^{nd}$ through-holes H2 may be provided.

Referring to the enlarged view of FIG. 8A, a height h1 of the through-hole H in z direction may be equal to a height h2 of the first insulating layer 240. When a first color quantum dot layer 220R and a second color quantum dot layer 220G are disposed in the $(1\text{-}1)^{st}$ opening 241R and the $(1\text{-}2)^{nd}$ opening 241G adjacent to each other, respectively, the first color quantum dot layer 220R and the second color quantum dot layer 220G may be mixed by the through-hole H. That is, the first color quantum dot layer 220R and the second color quantum dot layer 220G may be integrally formed (i.e., monolithic).

That the first color quantum dot layer 220R and the second color quantum dot layer 220G are integrally formed may be understood as follows: when a first color emission layer included in the first light-emitting device OLED1 and the second light-emitting device OLED2 emits light of a first wavelength band, both the first color quantum dot layer 220R and the second color quantum dot layer 220G commonly convert the light of the first wavelength band emitted by the first color emission layer into light of a second wavelength band.

Although the first color quantum dot layer 220R and the second color quantum dot layer 220G have been described, the same may apply to a transmissive layer 220B arranged in the $(1\text{-}3)^{rd}$ openings 241B. In FIGS. 8A and 8B, the transmissive layer 220B may also be integrally formed with the first color quantum dot layer 220R and the second color quantum dot layer 220G, and the transmissive layer 220B may be formed such that quantum dots are dispersed in a resin, just like the first color quantum dot layer 220R and the second color quantum dot layer 220G. Also, when the first color emission layer included in the third light-emitting device OLED3 emits light of the first wavelength band, the transmissive layer 220B may convert the light of the first wavelength band emitted by the first color emission layer into light of the second wavelength band in the same manner as the first color quantum dot layer 220R and the second color quantum dot layer 220G. That is, because the first color quantum dot layer 220R, the second color quantum dot layer 220G, and the transmissive layer 220B are all integrally formed, the first color quantum dot layer 220R, the second color quantum dot layer 220G, and the transmissive layer 220B may be distinguished as one first quantum dot layer 220.

The pixels such as the first to third pixels PX1, PX2, and PX3 may be arranged side by side in the x direction and the y direction, as illustrated in FIGS. 8A and 8B. In this case, the first insulating layer 240 arranged between the pixels that implement light of the same color may define through-holes H. Quantum dot layers may be shared with each other through the through-holes H defined in the first insulating layer 240 arranged between the pixels, just like a first quantum dot layer 220, a second quantum dot layer 220', and a third quantum dot layer 220".

Referring to FIG. 8C, the first quantum dot layer 220 may be arranged in the $(1\text{-}1)^{st}$ through-hole H1, and the second quantum dot layer 220' and the third quantum dot layer 220" may also be arranged in the through-holes defined in the first insulating layer 240. That is, the first quantum dot layer 220 may be commonly arranged in the first pixel PX1 and the second pixel PX2, located adjacent to each other, through the $(1\text{-}1)^{st}$ through-hole H1. The same may apply to the second quantum dot layer 220' and the third quantum dot layer 220".

The first quantum dot layer 220 may convert light of a first wavelength band generated by the light-emitting device such as the OLED into light of a second wavelength band, the second quantum dot layer 220' may convert light of a first wavelength band generated by the light-emitting device into light of a third wavelength band, and the third quantum dot layer 220" may convert light of a first wavelength band generated by the light-emitting device into light of a fourth wavelength band. Also, at least one of the first quantum dot layer 220, the second quantum dot layer 220', and the third quantum dot layer 220" may be a transmissive layer that transmits light emitted from the light-emitting device as it is.

As a comparative example, an insulating layer defining an opening in which a quantum dot layer is disposed may not define a through-hole. In a process of attaching the color filter unit to the display unit, a filler is coated. The filler may not be uniformly spread between the color filter unit and the display unit. In this case, spots or the like may appear on an image displayed by the display apparatus.

However, the display apparatus 1 according to the embodiment may include the first insulating layer 240 located on the lower surface of the upper substrate 200 in the direction of the lower substrate 100. The first insulating layer 240 may define the $(1\text{-}1)^{st}$ through-hole H1 connecting the $(1\text{-}1)^{st}$ opening 241R corresponding to the first emission area EA1 to the $(1\text{-}2)^{nd}$ opening 241G corresponding to the second emission area EA2. In this case, when the color filter unit CU is attached to the display unit DU, the $(1\text{-}1)^{st}$ through-hole H1 may serve as a passage through which the filler is able to move. The flow of the filler may be facilitated through the $(1\text{-}1)^{st}$ through-hole H1 such that the filler is uniformly spread between the color filter unit CU and the display unit DU and the appearance of spots or the like on an image displayed by the display apparatus 1 may be prevented.

Figure 9A:
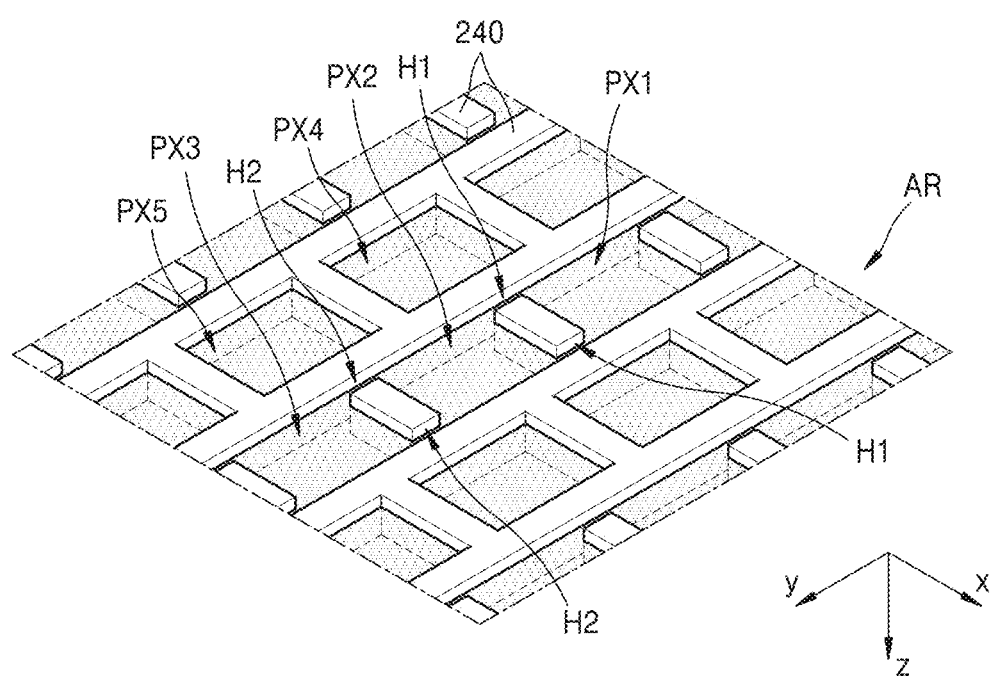
FIG. 9A is a schematic perspective view of a color filter unit according to an embodiment.
Figure 9B:
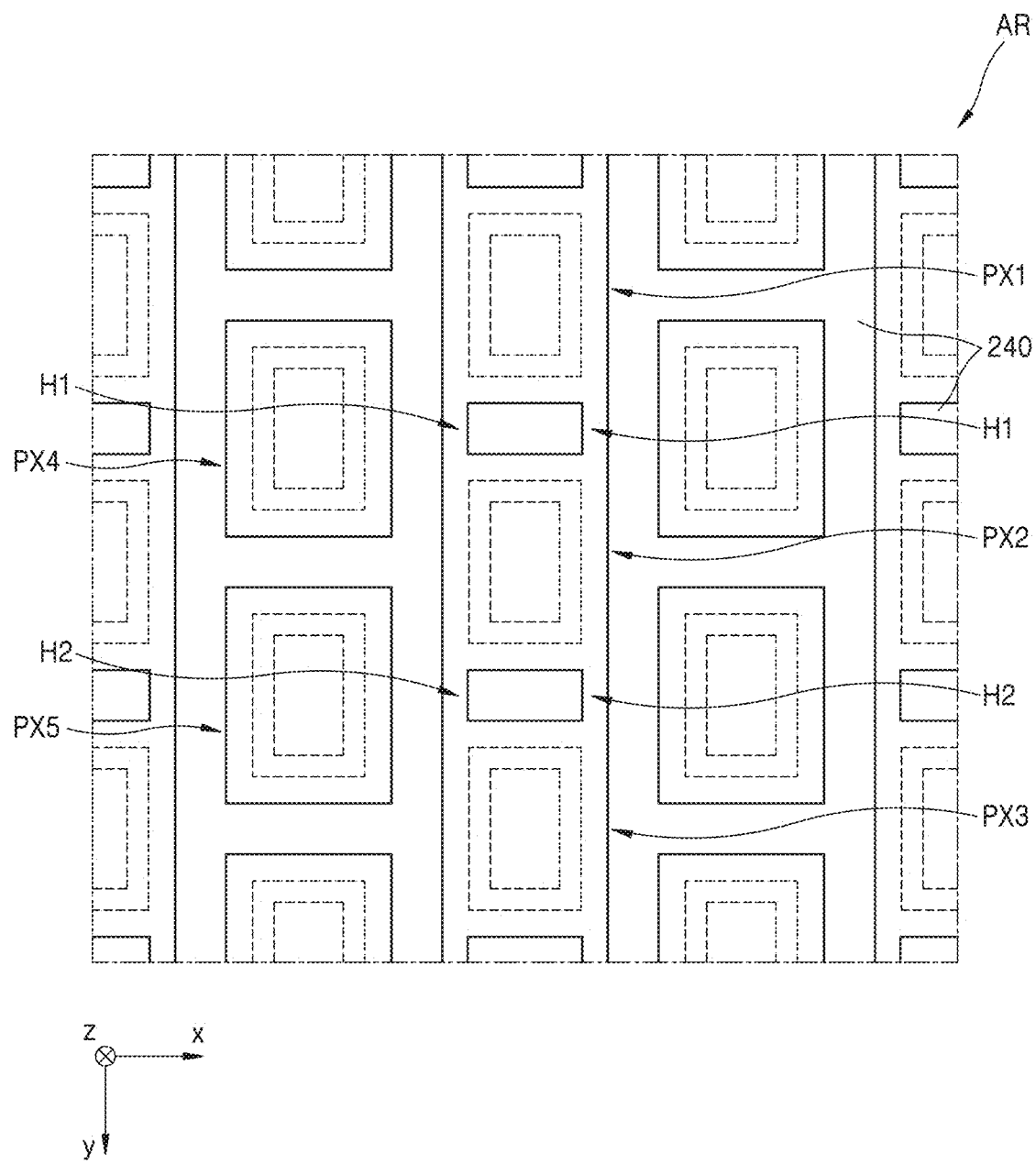
FIG. 9B is a schematic bottom view of a color filter unit according to an embodiment.

FIG. 9A is a schematic perspective view of the color filter unit according to an embodiment, and FIG. 9B is a schematic bottom view of the color filter unit according to an embodiment. Because FIGS. 9A and 9B correspond to partial modifications of FIGS. 8A and 8B, differences therebetween will be described.

As described above with reference to FIGS. 8A and 8B, a first insulating layer 240 may define a $(1\text{-}1)^{st}$ through-hole H1 connecting a $(1\text{-}1)^{st}$ opening 241R corresponding to a first pixel PX1 to a $(1\text{-}2)^{nd}$ opening 241G corresponding to a second pixel PX2. Also, a first insulating layer 240 may further define a $(1\text{-}2)^{nd}$ through-hole H2 connecting the $(1-2)^{nd}$ opening 241G corresponding to the second pixel PX2 to the $(1-3)^{rd}$ opening 241B corresponding to a third pixel PX3. The first to third pixels PX1, PX2, and PX3 may implement light of the same color. For example, the first to third pixels PX1, PX2, and PX3 may implement green light.

Referring to FIGS. 9A and 9B, openings corresponding to some pixels arranged in the y direction may not be connected to each other, unlike in FIGS. 8A and 8B. For example, a first insulating layer 240 arranged between a fourth pixel PX4 and a fifth pixel PX5 may not define through-holes. Therefore, an opening corresponding to the fourth pixel PX4 and an opening corresponding to the fifth pixel PX5 may not be connected to each other, and quantum dot layers arranged in the respective openings may be independently arranged.

Because the fourth pixel PX4 and the fifth pixel PX5 may each include independent quantum dot layers, the fourth pixel PX4 and the fifth pixel PX5 may implement light of different colors. For example, the fourth pixel PX4 may implement red light and the fifth pixel PX5 may implement blue light.

As illustrated in FIGS. 9A and 9B, a case in which the openings corresponding to some pixels arranged in the y direction are not connected to each other and a case in which the openings corresponding to some pixels arranged in the y direction are connected to each other may be repeatedly defined.

In this case, light of various colors may be implemented through a plurality of pixels. When the color filter unit CU is attached to the display unit DU, the flow of the filler may be facilitated through the through-holes such that the appearance of spots or the like on an image displayed by the display apparatus 1 may be prevented.

Figure 10A:
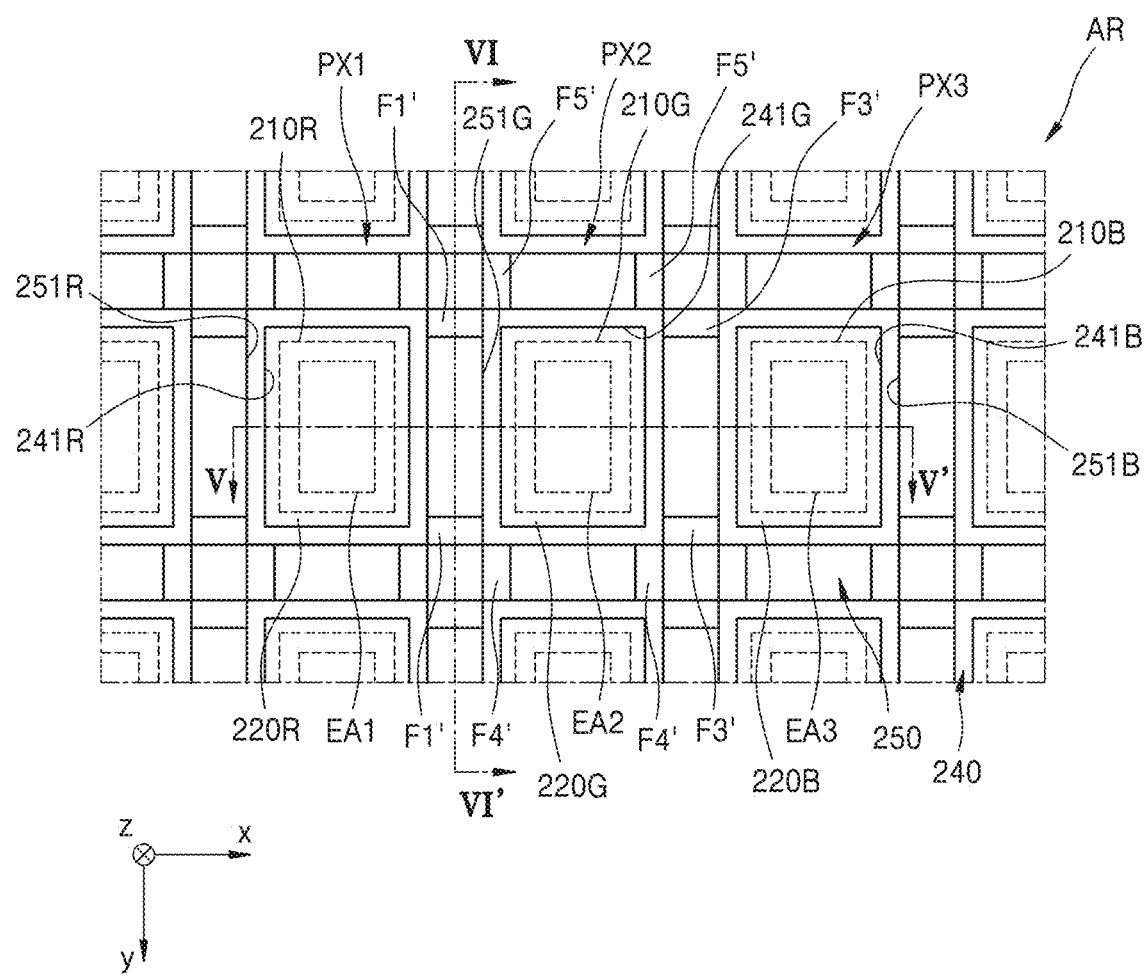
FIG. 10A is a schematic bottom view of a color filter unit according to an embodiment.
Figure 10B:
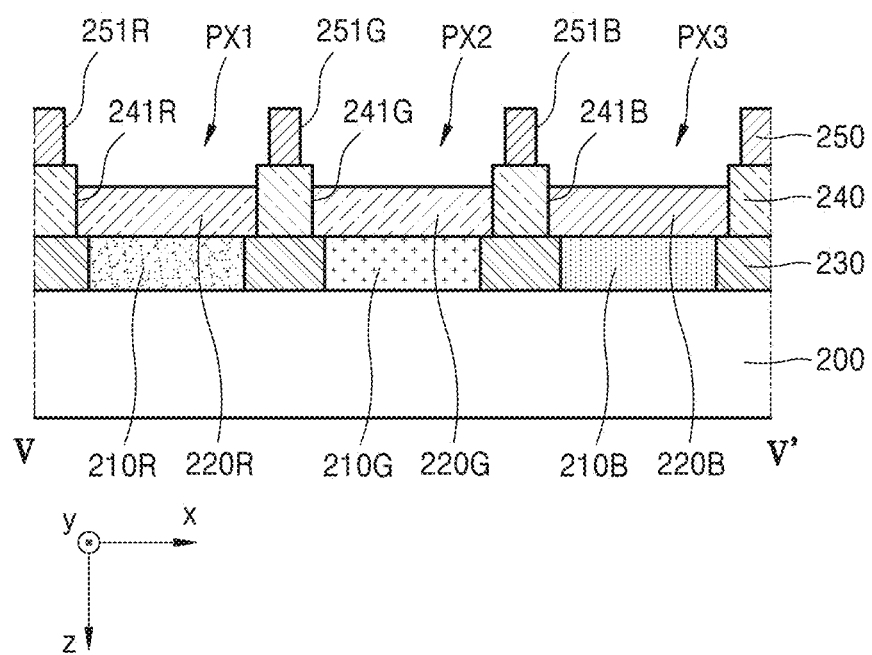
FIGS. 10B and 10C are schematic cross-sectional views of a color filter unit according to an embodiment.
Figure 10C:
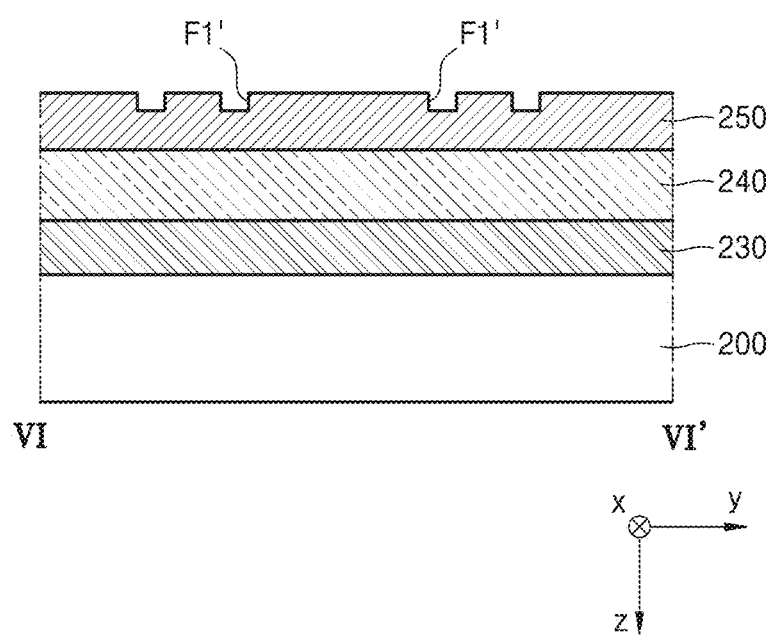

FIG. 10A is a schematic bottom view of a color filter unit according to an embodiment and is a schematic enlarged view of the color filter unit CU corresponding to the partial region AR of FIG. 1. FIGS. 10B and 10C are schematic cross-sectional views of the color filter unit according to an embodiment. FIG. 10B schematically illustrates a cross-section taken along line V-V of FIG. 10A, and FIG. 10C schematically illustrates a cross-section taken along line VI-VI' of FIG. 10A.

Referring to FIG. 10A, the display apparatus 1 according to the embodiment may include first to third pixels PX1, PX2, and PX3. This is just an example, and the display apparatus 1 may include more pixels as illustrated in FIG. 10A. The first to third pixels PX1, PX2, and PX3 may include first to third light-emitting devices OLED1, OLED2, and OLED3 (see FIG. 3) such as OLEDs, respectively. The first to third pixels PX1, PX2, and PX3 may emit, for example, red, green, blue, or white light through the first to third light-emitting devices OLED1, OLED2, and OLED3, respectively.

The first to third pixels PX1, PX2, and PX3 may include first to third emission areas EA1, EA2, and EA3, respectively. The first to third emission areas EA1, EA2, and EA3 may be areas in which light is generated and emitted to the outside. As illustrated in FIG. 10A, the first to third emission areas EA1, EA2, and EA3 may have a rectangular shape. The shapes of the first to third emission areas EA1, EA2, and EA3 may be variously changed. For example, the first to third emission areas EA1, EA2, and EA3 may have a polygonal shape such as a circle or an ellipse, a star shape, or a diamond shape.

Referring to FIG. 10A, a light blocking layer 230 defining a plurality of openings may be arranged on an upper substrate 200, and first to third color filter layers 210R, 210G, and 210B may be arranged in the openings, respectively. A first insulating layer 240 defining a $(1-1)^{st}$ opening 241R corresponding to the first emission area EA1, a $(1-2)^{nd}$ opening 241G corresponding to the second emission area EA2, and a $(1-3)^{rd}$ opening 241B corresponding to the third emission area EA3 may be arranged on the light blocking layer 230. A first color quantum dot layer 220R may be arranged in the $(1-1)^{st}$ opening 241R, a second color quantum dot layer 220G may be arranged in the $(1-2)^{nd}$ opening 241G, and a transmissive layer 220B may be arranged in the $(1-3)^{rd}$ opening 241B.

A second insulating layer 250 defining a $(2-1)^{st}$ opening 251R corresponding to the $(1-1)^{st}$ opening 241R, a $(2-2)^{nd}$ opening 251G corresponding to the $(1-2)^{nd}$ opening 241G, and a $(2-3)^{rd}$ openings 251B corresponding to the $(1-3)^{rd}$ opening 241B may be arranged on the first insulating layer 240. The size of the $(1-1)^{st}$ opening 241R defined in the first insulating layer 240 may be smaller than the size of the $(2-1)^{st}$ opening 251R defined in the second insulating layer 250. Although the $(1-1)^{st}$ opening 241R has been described, the same may apply to the $(1-2)^{nd}$ opening 241G and the $(1-3)^{rd}$ opening 241B.

Although FIG. 10B illustrates that various layers are stacked on the upper substrate 200 in the −z direction for convenience of description, the color filter unit CU according to the embodiment may be substantially attached to the display unit DU with the top and bottom inverted as illustrated in FIG. 3.

That is, lights emitted by the first to third light-emitting devices OLED1, OLED2, and OLED3 may pass through the first color quantum dot layer 220R, the second color quantum dot layer 220G, and the transmissive layer 220B, respectively. Also, the lights passing through the first color quantum dot layer 220R, the second color quantum dot layer 220G, and the transmissive layer 220B may pass through the first to third color filter layers 210R, 210G, and 210B, respectively. As illustrated in FIG. 10A, the areas of the first to third emission areas EA1, EA2, and EA3 in a plan view may be smaller than the areas of the first to third color filter layers 210R, 210G, and 210B.

In an embodiment, as illustrated in FIGS. 10A and 100, the second insulating layer 250 may define a $(2-1)^{st}$ groove F1' connecting the $(2-1)^{st}$ opening 251R to the $(2-2)^{nd}$ opening 251G. That is, a light blocking layer 230 may be arranged on the upper substrate 200, a first insulating layer 240 may be arranged on the light blocking layer 230, and a second insulating layer 250 defining grooves such as the $(2-1)^{st}$ groove F1' may be arranged on the first insulating layer 240. Also, the second insulating layer 250 may further define a $(2-3)^{rd}$ groove F3' connecting the $(2-2)^{nd}$ opening 251G to the $(2-3)^{rd}$ opening 251B.

Although two $(2-1)^{st}$ grooves F1' and two $(2-3)^{rd}$ grooves F3' are illustrated in FIG. 10A, one $(2-1)^{st}$ groove F1' and one $(2-3)^{rd}$ groove F3' may be provided, or three or more $(2-1)^{st}$ grooves F1' and three or more $(2-3)^{rd}$ grooves F3' may be provided in another embodiment. For example, four $(2-1)^{st}$ grooves F1' and four $(2-3)^{rd}$ grooves F3' may be provided. As another example, the number of $(2-1)^{st}$ grooves F1' may be different from the number of $(2-3)^{rd}$ grooves F3'. Three $(2-1)^{st}$ grooves F1' and two $(2-3)^{rd}$ grooves F3' may be provided.

A case in which the $(2-1)^{st}$ grooves F1' and the $(2-3)^{rd}$ grooves F3' are defined in the x direction in the first to third pixels PX1, PX2, and PX3 has been described, but the second insulating layer 250 may also define grooves in the y direction. That is, the pixel arranged above the second pixel PX2 may be connected to the $(2-2)^{nd}$ opening 251G corresponding to the second pixel PX2 through a $(2\text{-}5)^{th}$ groove F5'. The pixel arranged below the second pixel PX2 may be connected to the $(2\text{-}2)^{nd}$ opening 251G corresponding to the second pixel PX2 through a $(2\text{-}4)^{th}$ groove F4'. Although the second pixel PX2 has been described, the same may apply to other pixels such as the first pixel PX1 and the third pixel PX3.

As a comparative example, an insulating layer including an opening corresponding to a passage through which ink sprayed by a nozzle drops and moves during ink-jet printing may not define a groove. In a process of attaching the color filter unit to the display unit, a filler is coated. The filler may not be uniformly spread between the color filter unit and the display unit. In this case, spots or the like may appear on an image displayed by the display apparatus.

However, the display apparatus 1 according to the embodiment may include the second insulating layer 250 located on the lower surface of the upper substrate 200 in the direction of the lower substrate 100. The second insulating layer 250 may define the $(2\text{-}1)^{st}$ groove F1' connecting the $(2\text{-}1)^{st}$ opening 251R corresponding to the first emission area EA1 to the $(2\text{-}2)^{nd}$ opening 251G corresponding to the second emission area EA2. In this case, when the color filter unit CU is attached to the display unit DU, the $(2\text{-}1)^{st}$ groove F1' may serve as a passage through which the filler is able to move. The flow of the filler may be facilitated through the $(2\text{-}1)^{st}$ groove F1' such that the filler is uniformly spread between the color filter unit CU and the display unit DU and the appearance of spots or the like on an image displayed by the display apparatus 1 may be prevented.

Figure 11:
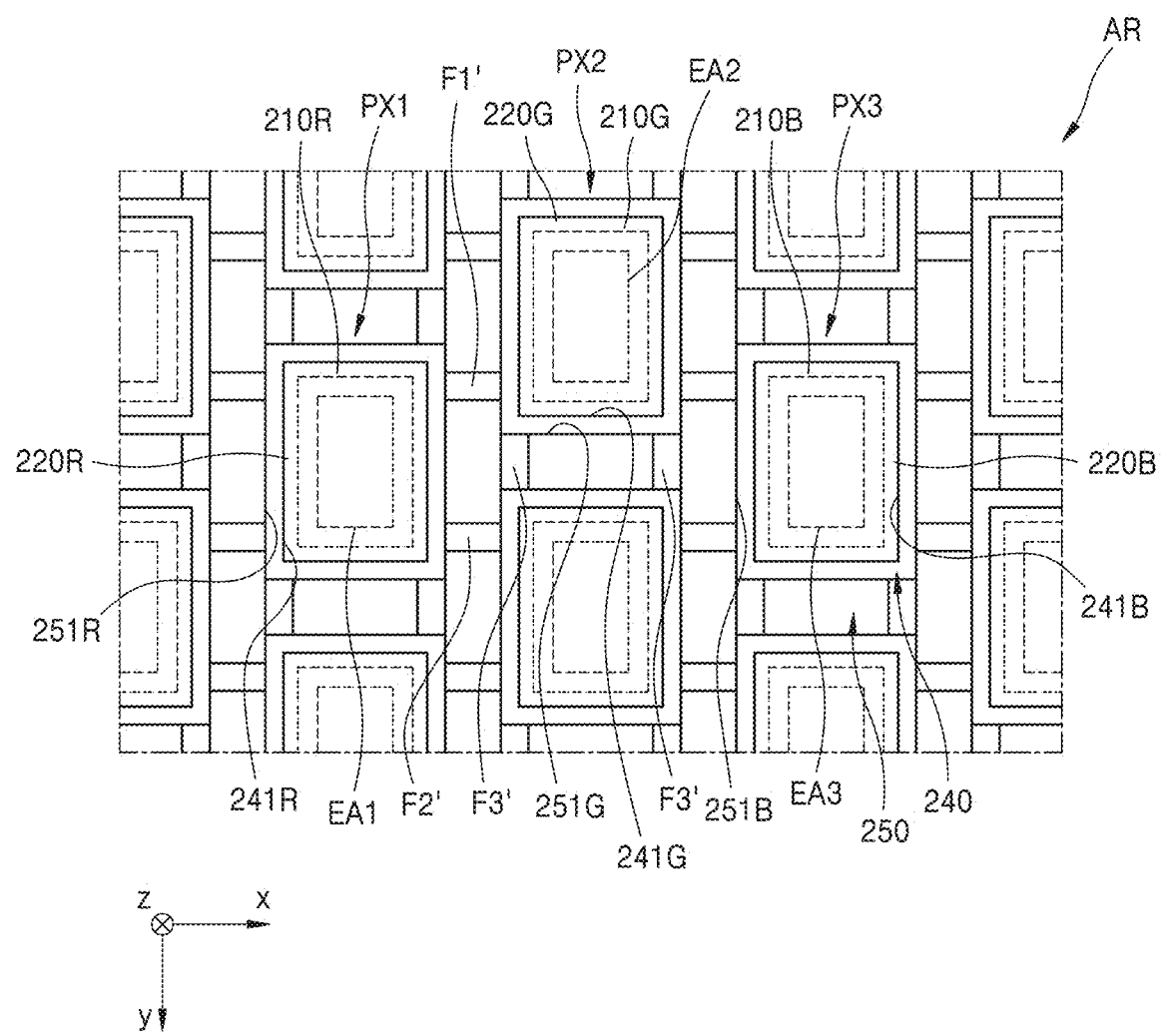
FIG. 11 is a schematic bottom view of a color filter unit according to an embodiment.

FIG. 11 is a schematic bottom view of a color filter unit according to an embodiment.

Referring to FIG. 11, first to third pixels PX1, PX2, and PX3 may not be arranged side by side and may be arranged to be offset from each other, unlike those illustrated in FIG. 10A. A second insulating layer 250 may define a $(2\text{-}1)^{st}$ opening 251R corresponding to a first emission area EA1 and a $(2\text{-}2)^{nd}$ opening 251G corresponding to a second emission area EA2 and may define a $(2\text{-}1)^{st}$ groove F1' connecting the $(2\text{-}1)^{st}$ opening 251R to the $(2\text{-}2)^{nd}$ opening 251G.

Also, the second insulating layer 250 may define a $(2\text{-}3)^{rd}$ opening 251B corresponding to a third emission area EA3 and may define a $(2\text{-}2)^{nd}$ groove F2' connecting the $(2\text{-}1)^{st}$ opening 251R to the $(2\text{-}3)^{rd}$ opening 251B. That is, the $(2\text{-}1)^{st}$ opening 251R may be connected to the $(2\text{-}2)^{nd}$ opening 251G and the $(2\text{-}3)^{rd}$ opening 251B through the $(2\text{-}1)^{st}$ groove F1' and the $(2\text{-}2)^{nd}$ groove F2', which are defined in the second insulating layer 250, respectively.

The second insulating layer 250 may define a $(2\text{-}3)^{rd}$ groove F3' connecting the $(2\text{-}2)^{nd}$ opening 251G to the $(2\text{-}3)^{rd}$ opening 251B. That is, the $(2\text{-}1)^{st}$ opening 251R, the $(2\text{-}2)^{nd}$ opening 251G, and the $(2\text{-}3)^{rd}$ opening 251B may be connected to each other through the $(2\text{-}1)^{st}$ groove F1', the $(2\text{-}2)^{nd}$ groove F2', and the $(2\text{-}3)^{rd}$ groove F3', which are defined in the second insulating layer 250. Although FIG. 11 illustrates one $(2\text{-}1)^{st}$ groove F1', one $(2\text{-}2)^{nd}$ groove F2', and two $(2\text{-}3)^{rd}$ grooves F3', this is just an example. The number of $(2\text{-}1)^{st}$ grooves F1', the number of $(2\text{-}2)^{nd}$ grooves F2', and the number of $(2\text{-}3)^{rd}$ grooves F3' may be variously modified.

The $(2\text{-}1)^{st}$ groove F1', the $(2\text{-}2)^{nd}$ groove F2', and the $(2\text{-}3)^{rd}$ groove F3' may serve as passages through which the filler used to attach the color filter unit CU to the display unit DU is able to move. The flow of the filler may be facilitated through the $(2\text{-}1)^{st}$ groove F1', the $(2\text{-}2)^{nd}$ groove F2', and the $(2\text{-}3)^{rd}$ groove F3' such that the filler is uniformly spread between the color filter unit CU and the display unit DU and the appearance of spots or the like on an image displayed by the display apparatus 1 may be prevented. Although the first to third pixels PX1, PX2, and PX3 have been described as an example, the other pixels may also be connected through grooves such as the $(2\text{-}1)^{st}$ groove F1', the $(2\text{-}2)^{nd}$ groove F2', and the $(2\text{-}3)^{rd}$ groove F3', as illustrated in FIG. 11.

Figure 12A:
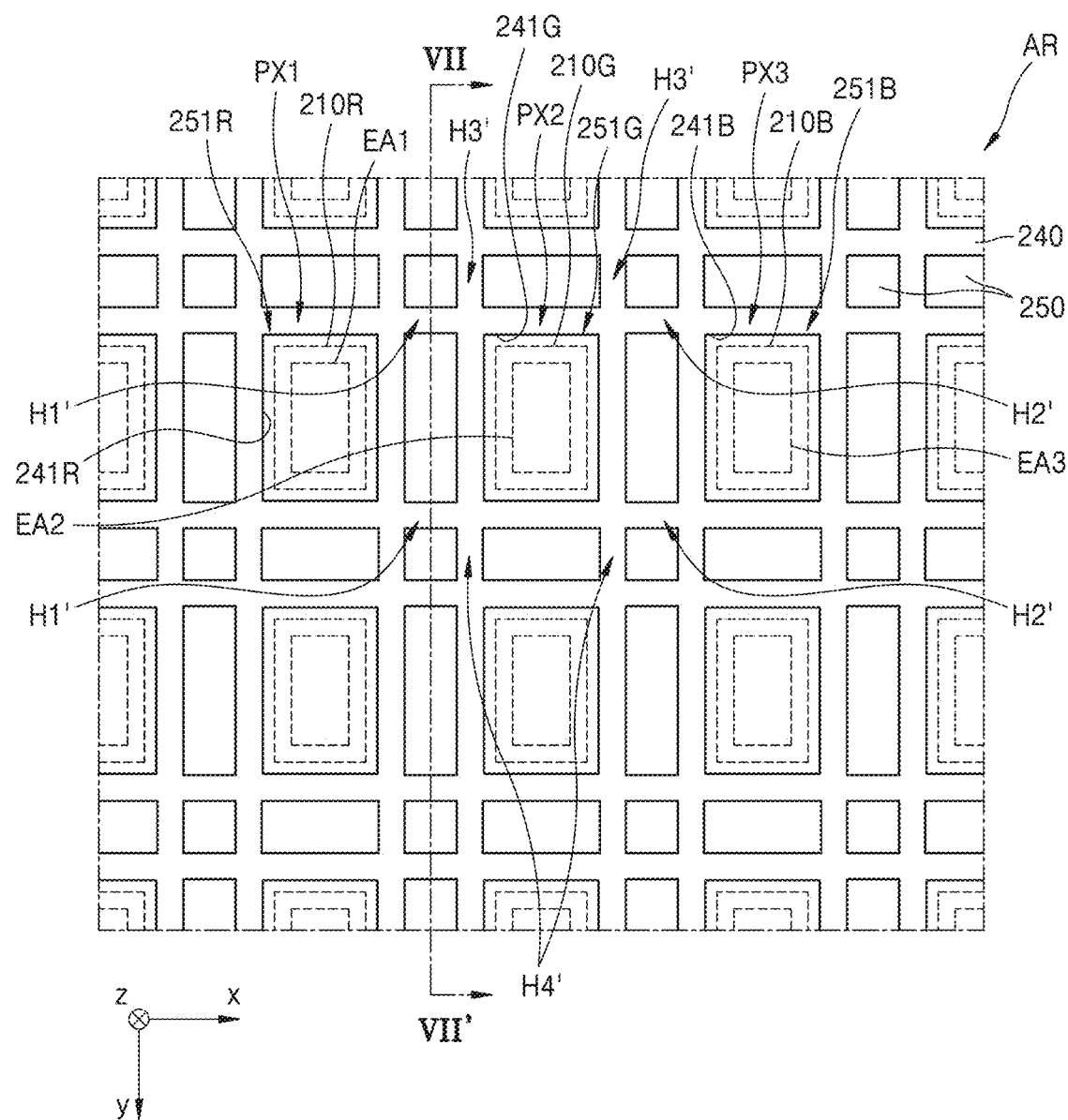
FIG. 12A is a schematic bottom view of a color filter unit according to an embodiment.
Figure 12B:
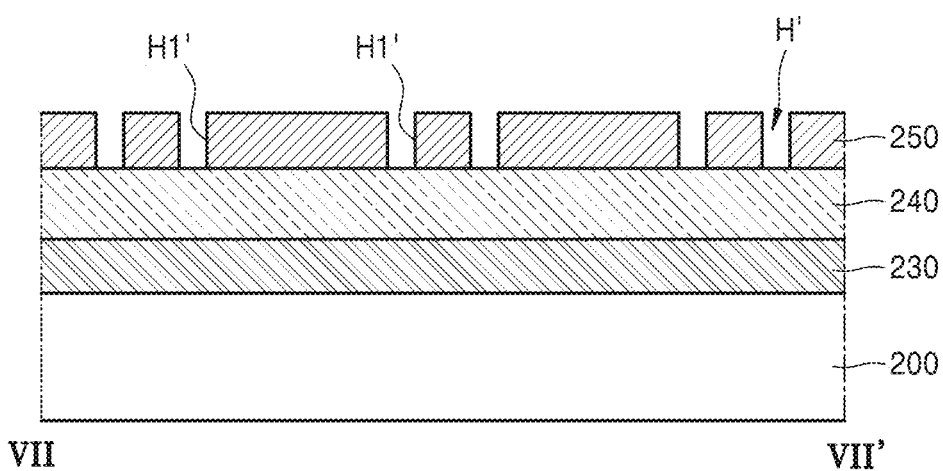
FIG. 12B is a schematic cross-sectional view of a color filter unit according to an embodiment.

FIG. 12A is a schematic bottom view of a color filter unit according to an embodiment, and FIG. 12B is a schematic cross-sectional view of the color filter unit according to an embodiment. FIG. 12B schematically illustrates a cross-section taken along line VII-VII' of FIG. 12A.

Referring to FIG. 12A, the display apparatus 1 according to the embodiment may include first to third pixels PX1, PX2, and PX3. This is just an example, and the display apparatus 1 may include more pixels as illustrated in FIG. 12A. The first to third pixels PX1, PX2, and PX3 may include first to third light-emitting devices OLED1, OLED2, and OLED3 (see FIG. 3) such as OLEDs, respectively. The first to third pixels PX1, PX2, and PX3 may emit, for example, red, green, blue, or white light through the first to third light-emitting devices OLED1, OLED2, and OLED3, respectively.

The first to third pixels PX1, PX2, and PX3 may include first to third emission areas EA1, EA2, and EA3, respectively. The first to third emission areas EA1, EA2, and EA3 may be areas in which light is generated and emitted to the outside. As illustrated in FIG. 12A, the first to third emission areas EA1, EA2, and EA3 may have a rectangular shape. The shapes of the first to third emission areas EA1, EA2, and EA3 may be variously changed. For example, the first to third emission areas EA1, EA2, and EA3 may have a polygonal shape such as a circle or an ellipse, a star shape, or a diamond shape.

In an embodiment, as illustrated in FIGS. 12A and 12B, a second insulating layer 250 may define a $(2\text{-}1)^{st}$ through-hole H1' connecting a $(2\text{-}1)^{st}$ opening 251R to a $(2\text{-}2)^{nd}$ opening 251G. That is, a light blocking layer 230 may be arranged on an upper substrate 200, a first insulating layer 240 may be arranged on the light blocking layer 230, and a second insulating layer 250 defining through-holes such as the $(2\text{-}1)^{st}$ through-hole H1' may be arranged on the first insulating layer 240. Also, the second insulating layer 250 may further define a $(2\text{-}2)^{nd}$ through-hole H2' connecting the $(2\text{-}2)^{nd}$ opening 251G to a $(2\text{-}3)^{rd}$ opening 251B. A part of the first insulating layer 240 may be exposed by the $(2\text{-}1)^{st}$ through-hole H1' and the $(2\text{-}2)^{nd}$ through-hole H2', which are defined in the second insulating layer 250.

Although two $(2\text{-}1)^{st}$ through-holes H1' and two $(2\text{-}2)^{nd}$ through-holes H2' are illustrated in FIG. 12A, one $(2\text{-}1)^{st}$ through-hole H1' and one $(2\text{-}2)^{nd}$ through-hole H2' may be provided, or three or more $(2\text{-}1)^{st}$ through-holes H1' and three or more $(2\text{-}2)^{nd}$ through-holes H2' may be provided in another embodiment. For example, four $(2\text{-}1)^{st}$ through-holes H1' and four $(2\text{-}2)^{nd}$ through-holes H2' may be provided. As another example, the number of $(2\text{-}1)^{st}$ through-holes H1' may be different from the number of $(2\text{-}2)^{nd}$ through-holes H2'. Three $(2\text{-}1)^{st}$ through-holes H1' and two $(2\text{-}2)^{nd}$ through-holes H2' may be provided.

A case in which the $(2\text{-}1)^{st}$ through-holes H1' and the $(2\text{-}2)^{nd}$ through-holes H2' are defined in the x direction in the first to third pixels PX1, PX2, and PX3 has been described, but the second insulating layer 250 may also define through-holes in the y direction. That is, the pixel arranged above the second pixel PX2 may be connected to the $(2\text{-}2)^{nd}$ opening 251G corresponding to the second pixel PX2 through a $(2\text{-}3)^{rd}$ through-hole H3'. The pixel arranged below the second pixel PX2 may be connected to the $(2-2)^{nd}$ opening 251G corresponding to the second pixel PX2 through a $(2-4)^{th}$ through-hole H4'. Although the second pixel PX2 has been described, the same may apply to the other pixels such as the first pixel PX1 and the third pixel PX3.

A part of the first insulating layer 240 may be exposed by through-holes such as the $(2-1)^{st}$ through-hole H1', the $(2-2)^{nd}$ through-hole H2', the $(2-3)^{rd}$ through-hole H3', and the $(2-4)^{th}$ through-hole H4', which are defined in the second insulating layer 250. As illustrated in FIG. 12A, the second insulating layer 250 may have an isolated shape.

As a comparative example, an insulating layer including an opening corresponding to a passage through which ink sprayed by a nozzle drops and moves during ink-jet printing may not define a through-hole. In a process of attaching the color filter unit to the display unit, a filler is coated. The filler may not be uniformly spread between the color filter unit and the display unit. In this case, spots or the like may appear on an image displayed by the display apparatus.

However, the display apparatus 1 according to the embodiment may include the second insulating layer 250 located on the lower surface of the upper substrate 200 in the direction of the lower substrate 100. The second insulating layer 250 may define the $(2-1)^{st}$ through-hole H1' connecting the $(2-1)^{st}$ opening 251R corresponding to the first emission area EA1 to the $(2-2)^{nd}$ opening 251G corresponding to the second emission area EA2. In this case, when the color filter unit CU is attached to the display unit DU, the $(2-1)^{st}$ through-hole H1' may serve as a passage through which the filler is able to move. The flow of the filler may be facilitated through the $(2-1)^{st}$ through-hole H1' such that the filler is uniformly spread between the color filter unit CU and the display unit DU and the appearance of spots or the like on an image displayed by the display apparatus 1 may be prevented.

Figure 13:
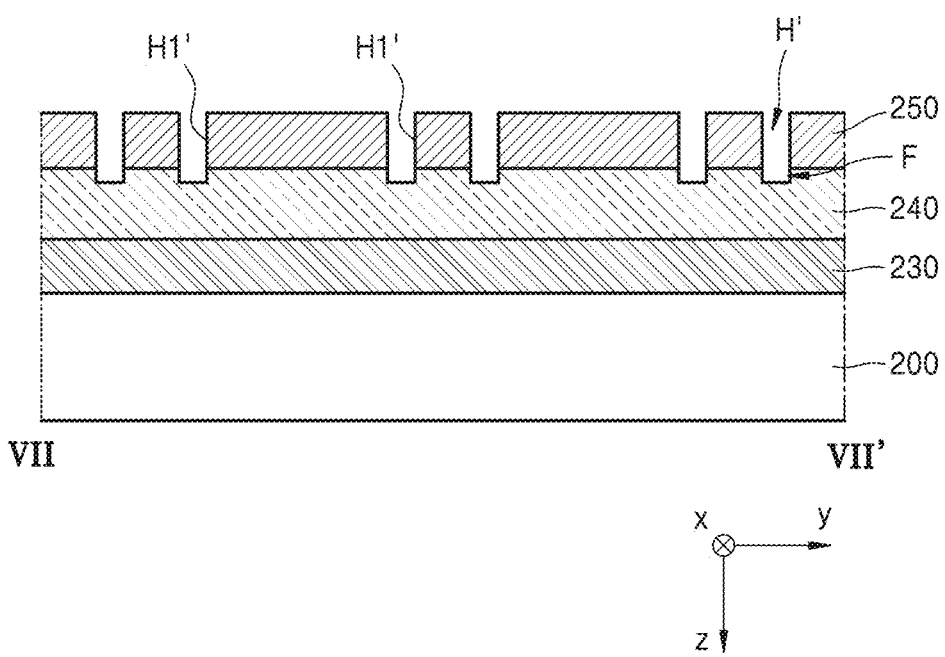
FIGS. 13 and 14 are schematic cross-sectional views of a color filter unit according to an embodiment.
Figure 14:
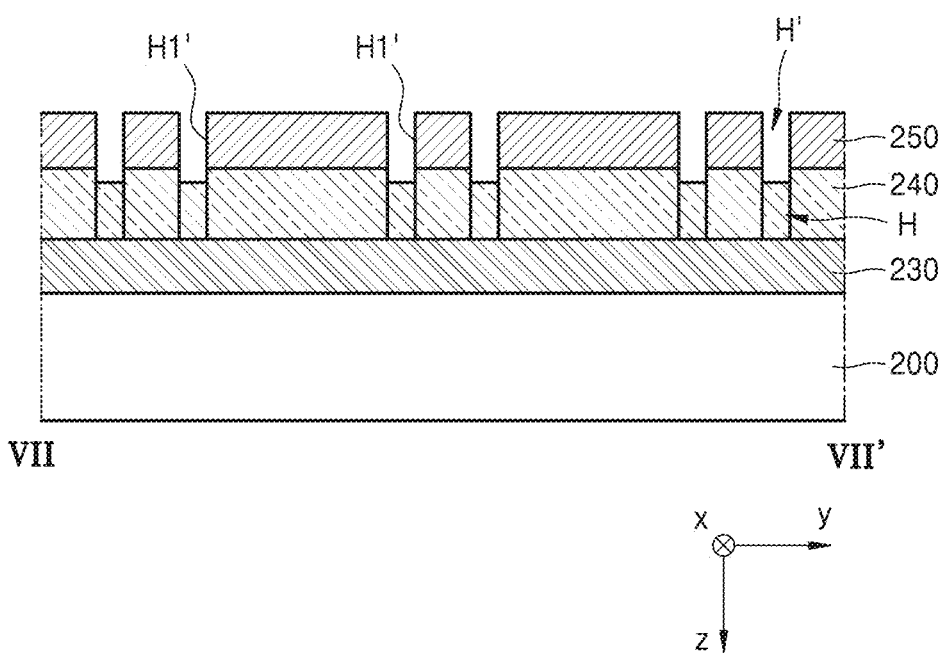

FIGS. 13 and 14 are schematic cross-sectional views of a color filter unit according to an embodiment. Because FIGS. 13 and 14 correspond to partial modifications of FIG. 12B, differences therebetween will be described.

Referring to FIGS. 13 and 14, a light blocking layer 230 may be arranged on an upper substrate 200, and a first insulating layer 240 may be arranged on the light blocking layer 230. A second insulating layer 250 may be arranged on the first insulating layer 240. As described above with reference to FIG. 12B, the second insulating layer 250 may define through-holes H' such as a $(2-1)^{st}$ through-holes H1'.

FIG. 13 schematically illustrates another embodiment of a cross-section taken along line VII-VII' of FIG. 12A. In an embodiment, as illustrated in FIG. 13, the first insulating layer 240 may define the grooves F described above with reference to FIG. 4 and the like. The grooves F may at least partially overlap the through-holes H' defined in the second insulating layer 250 in a plan view. Therefore, when the color filter unit CU is attached to the display unit DU, the through-hole H' and the grooves F may serve as a passage through which the filler is able to move. That is, the flow of the filler may be facilitated such that the filler is uniformly spread between the color filter unit CU and the display unit DU and the appearance of spots or the like on an image displayed by the display apparatus 1 may be prevented.

FIG. 14 schematically illustrates still another embodiment of a cross-section taken along line VII-VII' of FIG. 12A. In an embodiment, as illustrated in FIG. 14, the first insulating layer 240 may define the through-holes H described above with reference to FIG. 8A and the like. The through-holes H defined in the first insulating layer 240 may at least partially overlap the through-holes H' defined in the second insulating layer 250. Therefore, when the color filter unit CU is attached to the display unit DU, the through-holes H defined in the first insulating layer 240 and the through-holes H' defined in the second insulating layer 250 may serve as a passage through which the filler is able to move. The flow of the filler may be facilitated such that the appearance of spots or the like on an image derived by the display apparatus 1 may be prevented.

Figure 15:
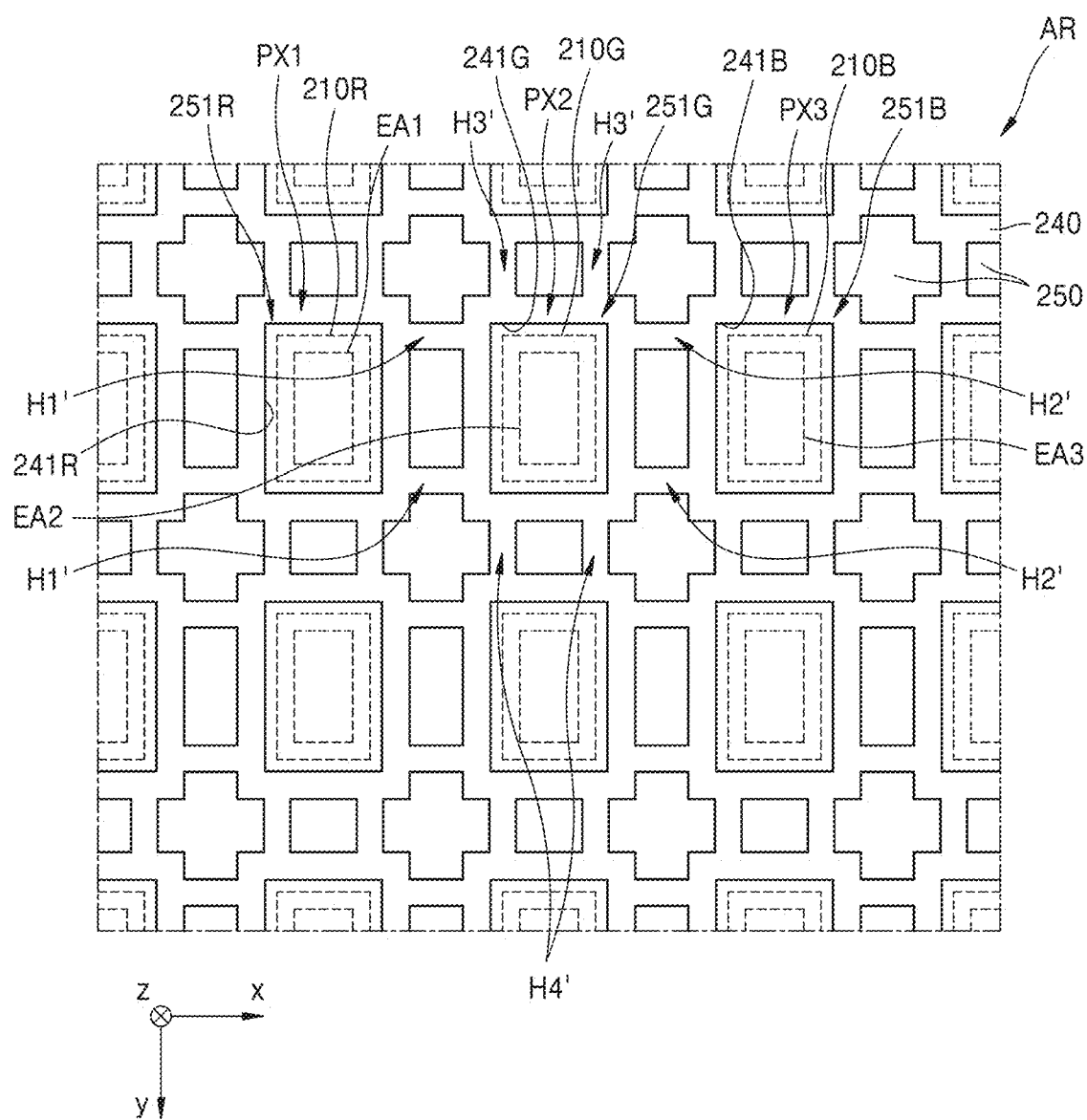
FIGS. 15 and 16 are schematic bottom views of a color filter unit according to an embodiment.

FIG. 15 is a schematic bottom view of a color filter unit according to an embodiment. Because FIG. 15 corresponds to a partial modification of FIG. 12A, differences therebetween will be described.

Referring to FIG. 15, a display apparatus 1 according to an embodiment may include first to third pixels PX1, PX2, and PX3. This is just an example, and the display apparatus 1 may include more pixels as illustrated in FIG. 15.

In an embodiment, as illustrated in FIG. 15, a second insulating layer 250 may define a $(2-1)^{st}$ through-hole H1' connecting a $(2-1)^{st}$ opening 251R to a $(2-2)^{nd}$ opening 251G. Also, the second insulating layer 250 may further define a $(2-2)^{nd}$ through-hole H2' connecting the $(2-2)^{nd}$ opening 251G to a $(2-3)^{rd}$ opening 251B. A part of the first insulating layer 240 may be exposed by the $(2-1)^{st}$ through-hole H1' and the $(2-2)^{nd}$ through-hole H2', which are defined in the second insulating layer 250.

Although two $(2-1)^{st}$ through-holes H1' and two $(2-2)^{nd}$ through-holes H2' are illustrated in FIG. 15, one $(2-1)^{st}$ through-hole H1' and one $(2-2)^{nd}$ through-hole H2' may be provided, or three or more $(2-1)^{st}$ through-holes H1' and three or more $(2-2)^{nd}$ through-holes H2' may be provided in another embodiment. For example, four $(2-1)^{st}$ through-holes H1' and four $(2-2)^{nd}$ through-holes H2' may be provided. As another example, the number of $(2-1)^{st}$ through-holes H1' may be different from the number of $(2-2)^{nd}$ through-holes H2'. Three $(2-1)^{st}$ through-holes H1' and two $(2-2)^{nd}$ through-holes H2' may be provided.

A case in which the $(2-1)^{st}$ through-holes H1' and the $(2-2)^{nd}$ through-holes H2' are defined in the x direction in the first to third pixels PX1, PX2, and PX3 has been described, but the second insulating layer 250 may also define through-holes in the y direction. That is, the pixel arranged above the second pixel PX2 may be connected to the $(2-2)^{nd}$ opening 251G corresponding to the second pixel PX2 through a $(2-3)^{rd}$ through-hole H3'. The pixel arranged below the second pixel PX2 may be connected to the $(2-2)^{nd}$ opening 251G corresponding to the second pixel PX2 through a $(2-4)^{th}$ through-hole H4'. Although the second pixel PX2 has been described, the same may apply to the other pixels such as the first pixel PX1 and the third pixel PX3.

A part of the first insulating layer 240 may be exposed by through-holes such as the $(2-1)^{st}$ through-hole H1', the $(2-2)^{nd}$ through-hole H2', the $(2-3)^{rd}$ through-hole H3', and the $(2-4)^{th}$ through-hole H4', which are defined in the second insulating layer 250. As illustrated in FIG. 15, the second insulating layer 250 may have an isolated shape.

In FIG. 12A, the $(2-1)^{st}$ through-hole H1', the $(2-2)^{nd}$ through-hole H2', the $(2-3)^{rd}$ through-hole H3', and the $(2-4)^{th}$ through-hole H4' are defined at both ends of each of the $(2-1)^{st}$ opening 251R, the $(2-2)^{nd}$ opening 251G, and the $(2-3)^{rd}$ opening 251B. Therefore, the second insulating layers 250 may all have a rectangular shape. However, in FIG. 15, the $(2-1)^{st}$ through-hole H1', the $(2-2)^{nd}$ through-hole H2', the $(2-3)^{rd}$ through-hole H3', and the $(2-4)^{th}$ through-hole H4' are not defined at both ends of each of the $(2-1)^{st}$ opening 251R, the $(2-2)^{nd}$ opening 251G, and the $(2-3)^{rd}$ opening 251B. Therefore, some of the second insulating layers 250 may have a cross shape. The shape of the second insulating layer 250 may be variously changed. For example, the second insulating layer 250 may have a polygonal shape such as a circle or an ellipse, a star shape, or a diamond shape.

Figure 16:
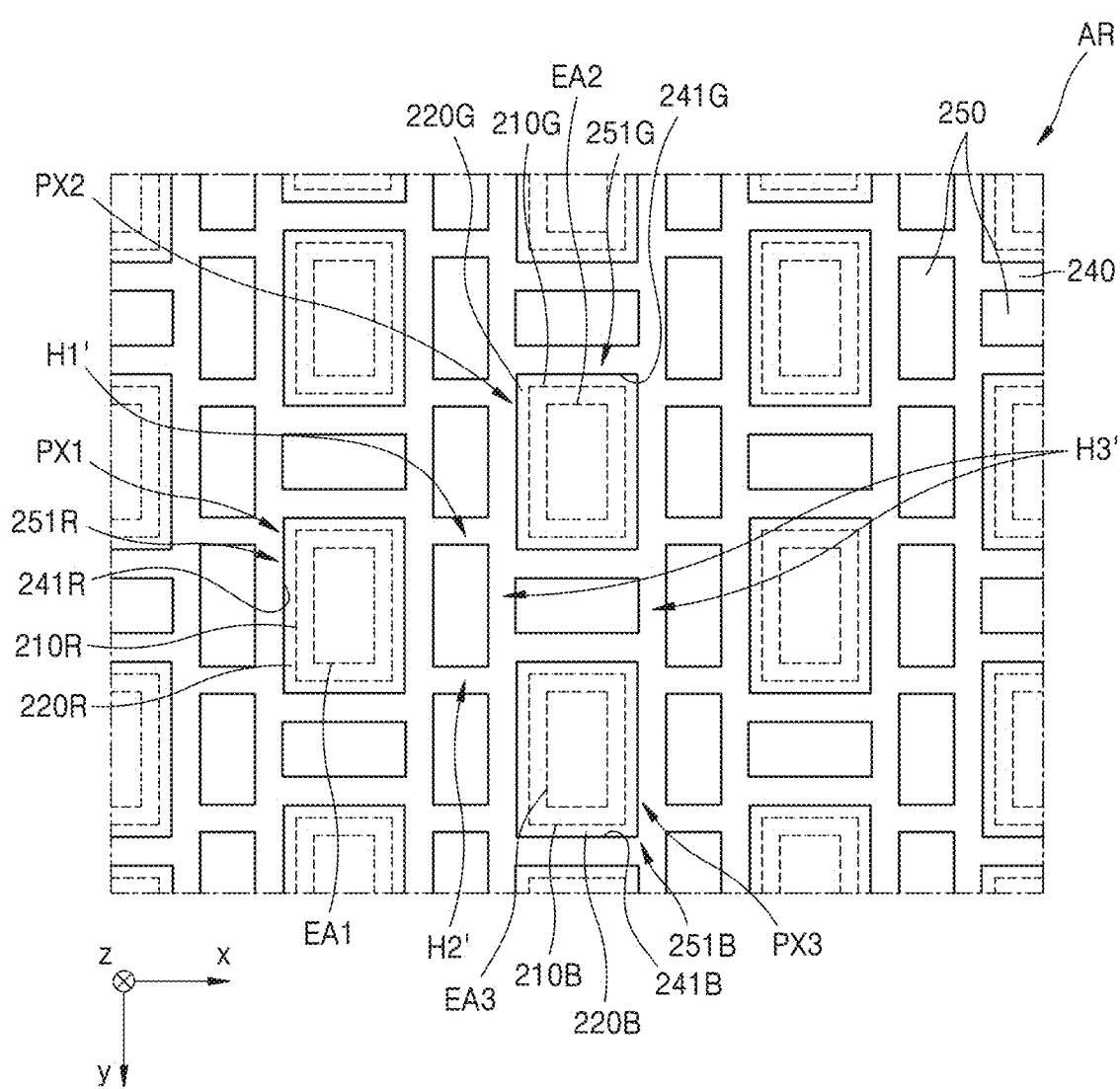

FIG. 16 is a schematic bottom view of a color filter unit according to an embodiment. Because FIG. 16 corresponds to a partial modification of FIG. 12A, differences therebetween will be described.

Referring to FIG. 16, first to third pixels PX1, PX2, and PX3 may not be arranged side by side and may be arranged to be offset from each other, unlike those illustrated in FIG. 12A. A second insulating layer 250 may define a $(2\text{-}1)^{st}$ opening 251R corresponding to a first emission area EA1 and a $(2\text{-}2)^{nd}$ opening 251G corresponding to a second emission area EA2 and may define a $(2\text{-}1)^{st}$ through-hole H1' connecting the $(2\text{-}1)^{st}$ opening 251R to the $(2\text{-}2)^{nd}$ opening 251G.

Also, the second insulating layer 250 may define a $(2\text{-}3)^{rd}$ opening 251B corresponding to a third emission area EA3 and may define a $(2\text{-}2)^{nd}$ through-hole H2' connecting the $(2\text{-}1)^{st}$ opening 251R to the $(2\text{-}3)^{rd}$ opening 251B. That is, the $(2\text{-}1)^{st}$ opening 251R may be connected to the $(2\text{-}2)^{nd}$ opening 251G and the $(2\text{-}3)^{rd}$ opening 251B through the $(2\text{-}1)^{st}$ through-hole H1' and the $(2\text{-}2)^{nd}$ through-hole H2', which are defined in the second insulating layer 250, respectively.

The second insulating layer 250 may define a $(2\text{-}3)^{rd}$ through-hole H3' connecting the $(2\text{-}2)^{nd}$ opening 251G to the $(2\text{-}3)^{rd}$ opening 251B. That is, the $(2\text{-}1)^{st}$ opening 251R, the $(2\text{-}2)^{nd}$ opening 251G, and the $(2\text{-}3)^{rd}$ opening 251B may be connected to each other through the $(2\text{-}1)^{st}$ through-hole H1', the $(2\text{-}2)^{nd}$ through-hole H2', and the $(2\text{-}3)^{rd}$ through-hole H3', which are defined in the second insulating layer 250. Although FIG. 16 illustrates one $(2\text{-}1)^{st}$ through-hole H1', one $(2\text{-}2)^{nd}$ through-hole H2', and two $(2\text{-}3)^{rd}$ through-holes H3', this is just an example. The number of $(2\text{-}1)^{st}$ through-holes H1', the number of $(2\text{-}2)^{nd}$ through-holes H2', and the number of $(2\text{-}3)^{rd}$ through-holes H3' may be variously modified.

A part of the first insulating layer 240 may be exposed by through-holes such as the $(2\text{-}1)^{st}$ through-hole H1', the $(2\text{-}2)^{nd}$ through-hole H2', and the $(2\text{-}3)^{rd}$ through-hole H3', which are defined in the second insulating layer 250. As illustrated in FIG. 16, the second insulating layer 250 may have an isolated shape.

The $(2\text{-}1)^{st}$ through-hole H1', the $(2\text{-}2)^{nd}$ through-hole H2', and the $(2\text{-}3)^{rd}$ through-hole H3' may serve as passages through which the filler used to attach the color filter unit CU to the display unit DU is able to move. Because the flow of the filler is facilitated through the $(2\text{-}1)^{st}$ through-hole H1', the $(2\text{-}2)^{nd}$ through-hole H2', and the $(2\text{-}3)^{rd}$ through-hole H3', the appearance of spots or the like on an image displayed by the display apparatus 1 may be prevented. Although the first to third pixels PX1, PX2, and PX3 have been described as an example, the other pixels may also be connected through the through-holes such as the $(2\text{-}1)^{st}$ through-hole H1', the $(2\text{-}2)^{nd}$ through-hole H2', and the $(2\text{-}3)^{rd}$ through-hole H3', as illustrated in FIG. 16.

Although the display apparatus has been described, the disclosure is not limited thereto. For example, methods of manufacturing the display apparatus will also fall within the scope of the disclosure.

According to one or more embodiments, a display apparatus in which image spot defects are improved may be implemented. The scope of the disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a lower substrate;
first to third light-emitting devices arranged on the lower substrate, the first to third light-emitting devices each comprising a color emission layer;
an upper substrate arranged above the lower substrate with the first to third light-emitting devices therebetween;
a first insulating layer arranged on a lower surface of the upper substrate in a direction to the lower substrate, the first insulating layer defining a $(1\text{-}1)^{st}$ opening corresponding to the first light-emitting device, a $(1\text{-}2)^{nd}$ opening corresponding to the second light-emitting device, and a $(1\text{-}1)^{st}$ groove connecting the $(1\text{-}1)^{st}$ opening to the $(1\text{-}2)^{nd}$ opening;
a first color quantum dot layer arranged in the $(1\text{-}1)^{st}$ opening; and
a second color quantum dot layer arranged in the $(1\text{-}2)^{nd}$ opening.

2. The display apparatus of claim 1, wherein a sum of a depth of the $(1\text{-}1)^{st}$ groove and a thickness of the first color quantum dot layer in a thickness direction is less than or equal to a height of the first insulating layer.

3. The display apparatus of claim 1, wherein the first insulating layer further defines a $(1\text{-}3)^{rd}$ opening corresponding to the third light-emitting device, and the first insulating layer further defines a $(1\text{-}2)^{nd}$ groove connecting the $(1\text{-}1)^{st}$ opening to the $(1\text{-}3)^{rd}$ opening.

4. The display apparatus of claim 3, wherein the first insulating layer further defines a $(1\text{-}3)^{rd}$ groove connecting the $(1\text{-}2)^{nd}$ opening to the $(1\text{-}3)^{rd}$ opening.

5. The display apparatus of claim 1, further comprising a second insulating layer arranged on the first insulating layer, wherein the second insulating layer defines a $(2\text{-}1)^{st}$ opening corresponding to the $(1\text{-}1)^{st}$ opening, a $(2\text{-}2)^{nd}$ opening corresponding to the $(1\text{-}2)^{nd}$ opening, and a $(2\text{-}1)^{st}$ through-hole connecting the $(2\text{-}1)^{st}$ opening to the $(2\text{-}2)^{nd}$ opening.

6. The display apparatus of claim 5, wherein the $(2\text{-}1)^{st}$ through-hole at least partially overlaps the $(1\text{-}1)^{st}$ groove in a plan view.

7. The display apparatus of claim 1, further comprising:
a first color filter layer arranged between the upper substrate and the first color quantum dot layer; and
a second color filter layer arranged between the upper substrate and the second color quantum dot layer.

8. The display apparatus of claim 1, wherein the first to third light-emitting devices further comprise:
first to third pixel electrodes; and
an opposite electrode corresponding to the first to third pixel electrodes, and
the color light emission layer is arranged between the opposite electrode and each of the first to third pixel electrodes.

9. The display apparatus of claim 1, wherein the first insulating layer comprises a light blocking material.

10. A display apparatus comprising:
a lower substrate;
first and second light-emitting devices arranged on the lower substrate and comprising a color emission layer;
an upper substrate arranged above the lower substrate with the first and second light-emitting devices therebetween;
a first insulating layer arranged on a lower surface of the upper substrate in a direction to the lower substrate, the first insulating layer defining a $(1\text{-}1)^{st}$ opening corresponding to the first light-emitting device, a $(1\text{-}2)^{nd}$ opening corresponding to the second light-emitting device, and a $(1\text{-}1)^{st}$ through-hole connecting the $(1\text{-}1)^{st}$ opening to the $(1\text{-}2)^{nd}$ opening;
a first color quantum dot layer arranged in the $(1\text{-}1)^{st}$ opening; and
a second color quantum dot layer arranged in the $(1\text{-}2)^{nd}$ opening.

11. The display apparatus of claim 10, wherein the color emission layer is configured to emit a light of a first wavelength band, and both the first color quantum dot layer and the second color quantum dot layer are configured to convert the light of the first wavelength band into a light of a second wavelength band.

12. The display apparatus of claim 10, wherein the first color quantum dot layer and the second color quantum dot layer are monolithic.

13. The display apparatus of claim 10, further comprising a second insulating layer arranged on the first insulating layer, the second insulating layer defining a $(2\text{-}1)^{st}$ opening corresponding to the $(1\text{-}1)^{st}$ opening, a $(2\text{-}2)^{nd}$ opening corresponding to the $(1\text{-}2)^{nd}$ opening, and a $(2\text{-}1)^{st}$ through-hole connecting the $(2\text{-}1)^{st}$ opening to the $(2\text{-}2)^{nd}$ opening.

14. A display apparatus comprising:
a lower substrate;
first to third light-emitting devices arranged on the lower substrate and comprising a color emission layer;
an upper substrate arranged above the lower substrate with the first to third light-emitting devices therebetween;
a first insulating layer arranged on a lower surface of the upper substrate in a direction to the lower substrate, the first insulating layer defining a $(1\text{-}1)^{st}$ opening corresponding to the first light-emitting device and a $(1\text{-}2)^{nd}$ opening corresponding to the second light-emitting device;
a second insulating layer arranged on the first insulating layer, the second insulating layer defining a $(2\text{-}1)^{st}$ opening corresponding to the $(1\text{-}1)^{st}$ opening, a $(2\text{-}2)^{nd}$ opening corresponding to the $(1\text{-}2)^{nd}$ opening, and a $(2\text{-}1)^{st}$ groove or a $(2\text{-}1)^{st}$ through-hole connecting the $(2\text{-}1)^{st}$ opening to the $(2\text{-}2)^{nd}$ opening;
a first color quantum dot layer arranged in the $(1\text{-}1)^{st}$ opening; and
a second color quantum dot layer arranged in the $(1\text{-}2)^{nd}$ opening.

15. The display apparatus of claim 14, wherein a part of the first insulating layer is exposed by the $(2\text{-}1)^{st}$ through-hole.

16. The display apparatus of claim 14, wherein the second insulating layer has an isolated shape.

17. The display apparatus of claim 14, wherein the first insulating layer further defines a $(1\text{-}3)^{rd}$ opening corresponding to the third light-emitting device, and the second insulating layer further defines a $(2\text{-}3)^{rd}$ opening corresponding to the $(1\text{-}3)^{rd}$ opening, and a $(2\text{-}2)^{nd}$ groove or a $(2\text{-}2)^{nd}$ through-hole connecting the $(2\text{-}1)^{st}$ opening to the $(2\text{-}3)^{rd}$ opening.

18. The display apparatus of claim 17, wherein the second insulating layer further defines a $(2\text{-}3)^{rd}$ groove or a $(2\text{-}3)^{rd}$ through-hole connecting the $(2\text{-}2)^{nd}$ opening to the $(2\text{-}3)^{rd}$ opening.

19. The display apparatus of claim 14, wherein the first insulating layer and the second insulating layer are black.

20. The display apparatus of claim 14, wherein the first insulating layer and the second insulating layer are blue.

21. The display apparatus of claim 14, wherein a size of the $(1\text{-}1)^{st}$ opening is smaller than a size of the $(2\text{-}1)^{st}$ opening.

* * * * *